United States Patent
Wang et al.

(10) Patent No.: US 7,346,881 B2
(45) Date of Patent: Mar. 18, 2008

(54) METHOD AND APPARATUS FOR ADDING ADVANCED INSTRUCTIONS IN AN EXTENSIBLE PROCESSOR ARCHITECTURE

(75) Inventors: Albert R. Wang, Fremont, CA (US); Earl A. Killian, Los Altos Hills, CA (US); Ricardo E. Gonzalez, Menlo Park, CA (US); Robert P. Wilson, Palo Alto, CA (US)

(73) Assignee: Tensilica, Inc., Santa Clara, CA (US)

( * ) Notice: Subject to any disclaimer, the term of this patent is extended or adjusted under 35 U.S.C. 154(b) by 914 days.

(21) Appl. No.: 10/146,655

(22) Filed: May 13, 2002

(65) Prior Publication Data

US 2005/0160402 A1   Jul. 21, 2005

(51) Int. Cl.
*G06F 17/50* (2006.01)
(52) U.S. Cl. .............................. 716/17; 716/16; 716/18
(58) Field of Classification Search .................... 716/1, 716/2, 16, 18
See application file for complete search history.

(56) References Cited

U.S. PATENT DOCUMENTS

| | | | |
|---|---|---|---|
| 4,236,206 | A | 11/1980 | Strecker et al. |
| 5,781,750 | A | 7/1998 | Blomgren |
| 5,826,071 | A | 10/1998 | Narayan |
| 5,896,521 | A | 4/1999 | Shackleford et al. |
| 6,023,757 | A | 2/2000 | Nishimoto et al. |
| 6,026,478 | A | 2/2000 | Dowling |
| 6,058,465 | A | 5/2000 | Nguyen |
| 6,233,596 | B1 | 5/2001 | Kubota et al. |
| 6,272,512 | B1 | 8/2001 | Golliver et al. |
| 6,366,998 | B1 | 4/2002 | Mohamed |
| 6,477,683 | B1 * | 11/2002 | Killian et al. .................. 716/1 |
| 6,496,922 | B1 | 12/2002 | Borrill |
| 6,549,999 | B2 | 4/2003 | Kishida |
| 6,704,859 | B1 | 3/2004 | Jacobs |

(Continued)

FOREIGN PATENT DOCUMENTS

JP    9-251477    9/1997

(Continued)

OTHER PUBLICATIONS

Vert, William Dr., "An Essay on Endian Order", *Dr. Bill's Notes on Little Endian vs. Big Engian*, at http://www.cs.umass.edu/-verts/cs32/endian.html, Apr. 19, 1996.

(Continued)

*Primary Examiner*—Thuan Do
(74) *Attorney, Agent, or Firm*—Pillsbury Winthrop et al.

(57) ABSTRACT

A system for adding advanced instructions to a microprocessor includes a language for formally capturing the new instructions and a method for generating hardware implementations and software tools for the extended processors. The extension language provides for additions of VLIW instructions, complex load/store instructions, more powerful description styles using functions, more powerful register operands, and a new set of built-in modules. The method is capable of generating fully-pipelined micro-architectural implementations for the new instructions in the form of synthesizable HDL descriptions which can be processed by standard CAD tools. The method is also capable of generating software components for extending software development tools for the microprocessor with new instructions.

17 Claims, 17 Drawing Sheets

U.S. PATENT DOCUMENTS

| | | | |
|---|---|---|---|
| 6,826,679 | B1 | 11/2004 | Laurenti et al. |
| 2001/0032305 | A1 | 10/2001 | Barry |
| 2003/0014457 | A1 | 1/2003 | Desai |

FOREIGN PATENT DOCUMENTS

| | | |
|---|---|---|
| JP | 10-134032 | 5/1998 |
| JP | 2000-298652 | 10/2000 |
| WO | WO 00/46704 | 8/2000 |
| WO | WO 01/61576 | 8/2001 |
| WO | WO 01/73571 | 10/2001 |

OTHER PUBLICATIONS

Berekovic, M., et al., "A Programmable Co-Processor for MPEG-4 Video," IEEE International Conf. on Acoustics, Speec & Signal Processing, p. 7-11, (May 16, 2001).

Ercanli E., et al., "A Register File and Scheduling Model for Application Specific Processor Synthesis," Proc. of 33rd Design Automation Conf., p. 35-40, (Jun. 16, 1996).

Iseli, C., et al., "AC++ compiler for FPGA Custom Execution Units Synthesis," Proc. of IEEE Symp on FPGAs for Custom Computing Machines, p. 173-179, (Apr. 16, 1995).

Takano, H., et al., "A 4 GOPS 3 Way-VLIW Image Recognition Processor Basedon a Configurable Media Processor," IEICE Trans on Elec., p. 347-351, (Feb. 16, 2002).

* cited by examiner

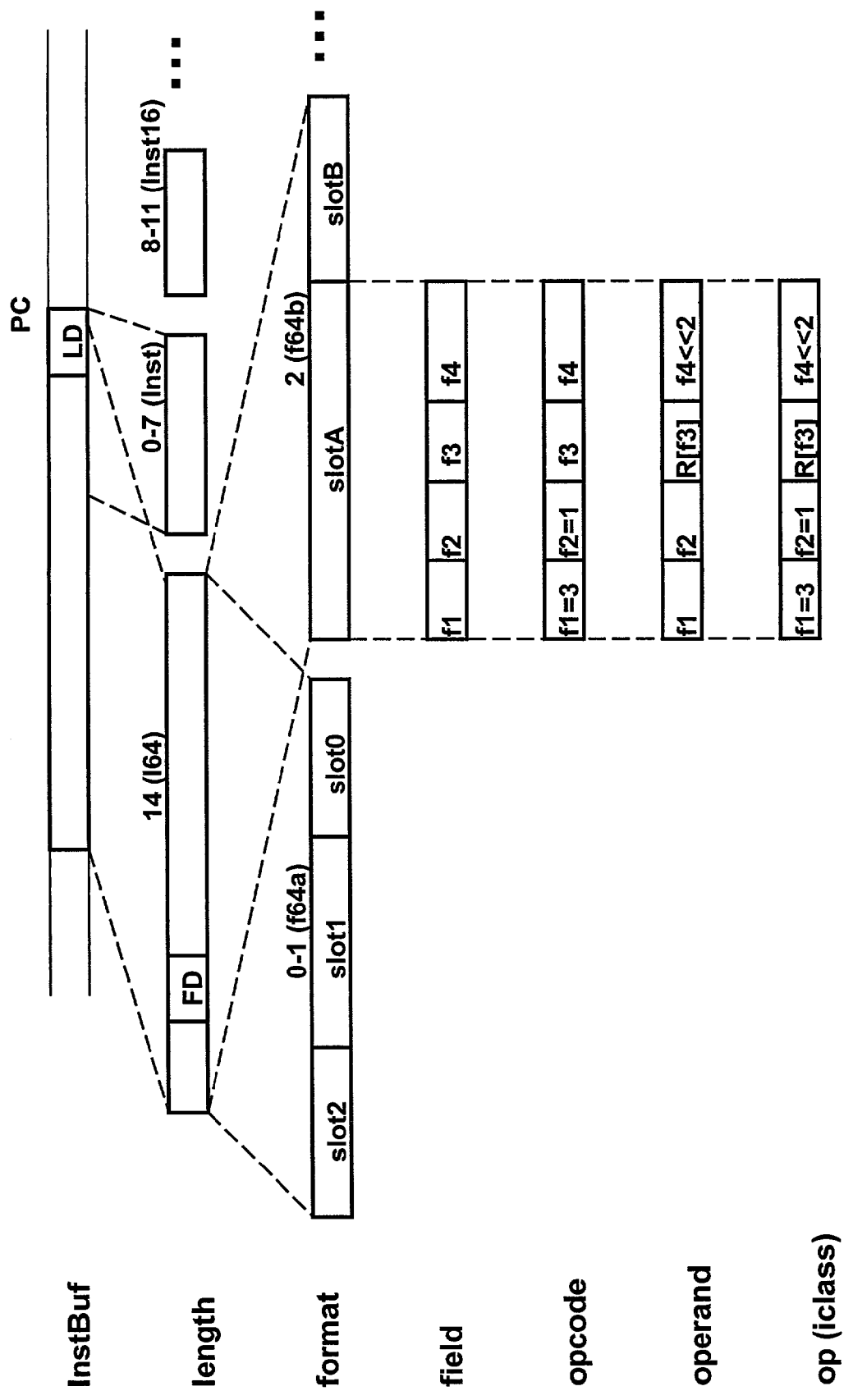

METHOD AND APPARATUS FOR ADDING ADVANCED INSTRUCTIONS IN AN EXTENSIBLE PROCESSOR ARCHITECTURE

CROSS-REFERENCE TO RELATED APPLICATIONS

The present application is related to U.S. application Ser. No. 10/145,380, and U.S. application Ser. No. 10/146,651, both filed concurrently herewith and commonly owned by the present assignee, the contents of which are incorporated herein by reference.

FIELD OF THE INVENTION

The present invention relates generally to microprocessors, and more particularly, to a method and apparatus for adding advanced instruction extensions to a microprocessor.

BACKGROUND OF THE INVENTION

New application-focused system-on-chip platforms motivate new application-specific processors. Configurable and extensible processor architectures offer the efficiency of tuned logic solutions with the flexibility of standard high-level programming methodology. Automated extension of processors and the associated software tools (compilers, debuggers, simulators and real-time operating systems) enables the use of such configurable and extensible processors. At the same time, designing at the level of software and instruction set architecture significantly shortens the design cycle and reduces verification effort and risk.

U.S. Pat. No. 6,282,633, issued Aug. 28, 2001 and entitled, "High Data Density RISC Processor," U.S. Pat. No. 6,477,683, issued Nov. 5, 2002 and entitled "Automated Processor Generation System for Designing a Configurable Processor and Software," U.S. Pat. No. 6,477,697, issued Nov. 5, 2002 and entitled "System for Adding Complex Instruction Extensions to a Microprocessor," and U.S. Pat. No. 7,036,106, issued Apr. 25, 2006 and entitled "Improved Automated Processor Generation System for Designing a Configurable Processor and Software," all commonly owned by the present assignee and incorporated herein by reference, dramatically advanced the state of the art of microprocessor architecture and design.

More particularly, these previous patents and applications described in detail a high-performance RISC processor, as well as a system that is able to generate a customized version of such a high-performance RISC processor based on user specifications (e.g., number of interrupts, width of processor interface, size of instruction/data cache, inclusion of MAC or multiplier) and implementation goals (e.g., target ASIC technology, speed, gate count, power dissipation, prioritization). The system generates a Register Transfer Level (RTL) representation of the processor, along with the software tools for the processor (compiler, linker, assembler, debugger, simulator, profiler, etc.), and the set of synthesis and place and route scripts to transform the RTL representation into a manufacturable geometric representation. The system further includes evaluation tools that allow for processor extensions to provide hardware support for commonly used functions in the application to achieve an ideal trade-off between software flexibility and hardware performance.

Generally, as shown in FIG. 1, the processor 102 generated by the system can include a configurable core 104 that is substantially the processor described in U.S. Pat. No. 6,282,633, and an optional set of application-specific processor extensions 106, which extensions may be described by Tensilica Instruction Extension (TIE) language instructions, and/or other high level hardware description language instructions, as detailed in the above-referenced applications. The processor and generation system of the above-referenced patents and applications are embodied in products that are commercially available from Tensilica, Inc. of Santa Clara, Calif.

Although the above processor and generation system provided many advantages, the processor was limited by restricting an instruction to perform a single computational task, however complex it may be. Increasing the number of computational tasks which can be performed simultaneously is a key to further improve the performance of embedded systems. To achieve this goal, several prior art microprocessors (e.g., the Intel IA-64 architecture), typically called VLIW machines, were invented to allow multiple operations to be packed into a single instruction for concurrent execution. In such a microprocessor, an instruction contains multiple operational slots, each capable of performing a set of operations independent of the others. The concurrency is achieved by a C/C++ compiler detecting parallel computational operations and packing the operations into VLIW instructions for simultaneous execution, or by the programmer manually grouping operations into VLIW instructions. However, all these prior art VLIW machines are limited to have a fixed instruction set, and cannot be configured to support application-specific extensions.

SUMMARY OF THE INVENTION

The present invention is directed to a system for adding advanced instructions to a microprocessor. The system includes a language for formally capturing the new instructions and a method for generating hardware implementations and software tools for the extended processors. The extension language provides for additions of VLIW instructions, complex load/store instructions, more powerful description styles using functions, more powerful register operands, instructions which generate exceptions, and a new set of built-in modules. The method is capable of generating fully-pipelined micro-architectural implementations for the new instructions in the form of synthesizable HDL descriptions which can be processed by standard CAD tools. The method is also capable of generating software components for extending software development tools for the microprocessor with new instructions.

According to one aspect, the processor generation system described in this invention improves both the configurable and extensible aspects of the processor generation systems described in the prior patent and applications, as well as improves upon fixed instruction set VLIW machines, by allowing system designers to design a VLIW microprocessor customized for a specific application to achieve higher performance, lower hardware cost, and lower power consumption.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 4 is a diagram illustrating how VLIW instructions are processed in accordance with an aspect of the invention;

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration. The Tensilica Instruction Extension (TIE) Language Reference Manual forms part of the present disclosure, is attached as Appendix C hereto and is incorporated herein by reference.

Figure 1:
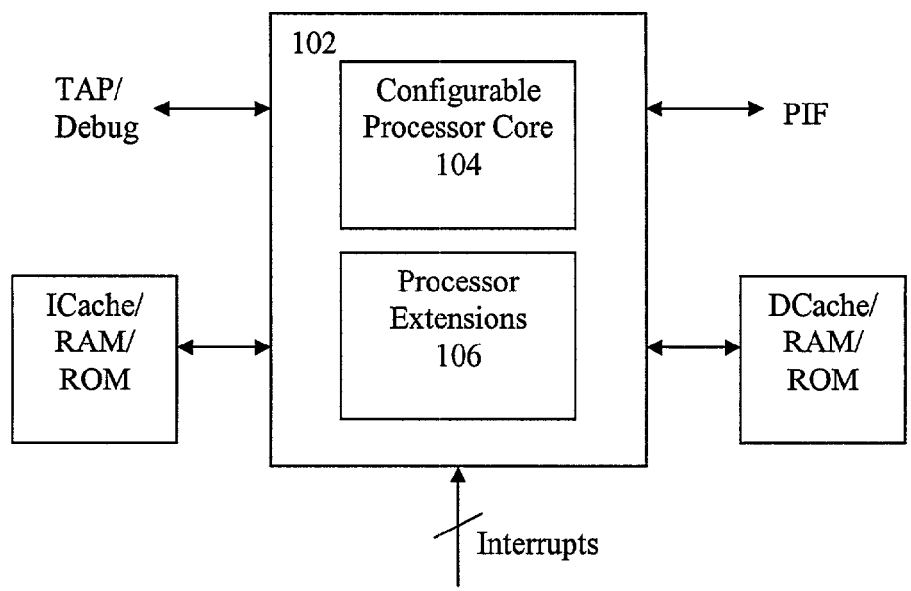
FIG. 1 is a block diagram illustrating a high performance processor.
Figure 2:
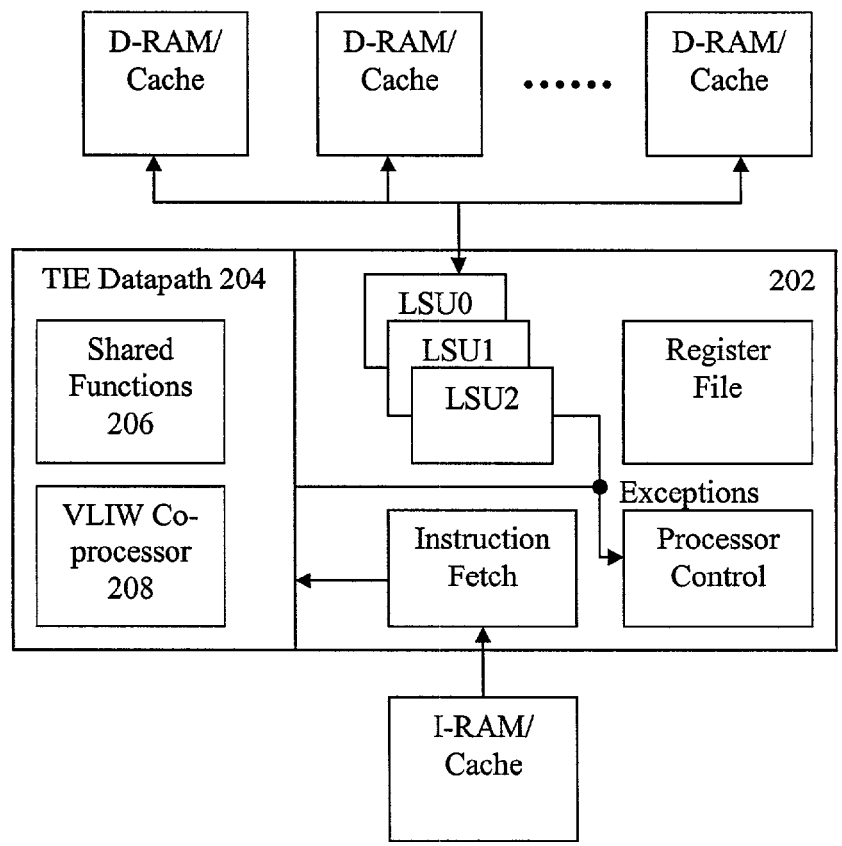
FIG. 2 is a block diagram illustrating a high performance processor generated in accordance with the principles of the invention.

FIG. 2 is a top-level diagram illustrating an example generated processor made possible in accordance with instruction extensions of the invention. As shown in FIG. 2, in general, the generated processor includes an instruction fetch unit 210 that is able to decode advanced instructions such as VLIW instructions. The system includes an enhanced extension language (TIE) for formal capturing of both the new instructions for execution by VLIW co-processor 208, as well as other customized instructions for the TIE datapath 204. The extension language further provides for complex load/store instructions for use by a configurable number of load/store units 212, more powerful description styles including shared functions 206, more powerful register operands for exploiting register file 214, new ways of defining processor exceptions during run-time operations, and a new set of built-in modules.

This invention builds upon the technology described in the prior patent and applications, in which the basic TIE language and its compiler and other tools are described for generating a customized high performance processor, along with supporting hardware descriptions and software tools for the customized processor. This invention extends the TIE language with new constructs for generating additional processor hardware and associated tools, and this disclosure describes what the new language constructs are and how the TIE compiler supports these constructs. Accordingly, the contents of the prior disclosures are incorporated herein by reference, and details of only the new features of the invention will be provided. In sum, however, the combined disclosures will enable those skilled in the art to practice a method for generating both hardware implementations and software tools for the extended processors.

As set forth above, and as shown in FIG. 2, an aspect of the present invention is the ability to decode advanced instructions, such as VLIW instructions for execution by a VLIW co-processor. One possible implementation of a VLIW co-processor that can take advantage of the VLIW instructions enabled by this invention is described in more detail in co-pending application Ser. No. 10/145,380. In such an example implementation, the VLIW instructions are provided in addition to 16- and 24-bit instructions for execution by processor core 202 (the structure for executing the core instructions is not shown in detail for clarity of the invention, but can be implemented by the structure described in U.S. Pat. No. 6,282,633, for example).

Figures 3A, 3B:
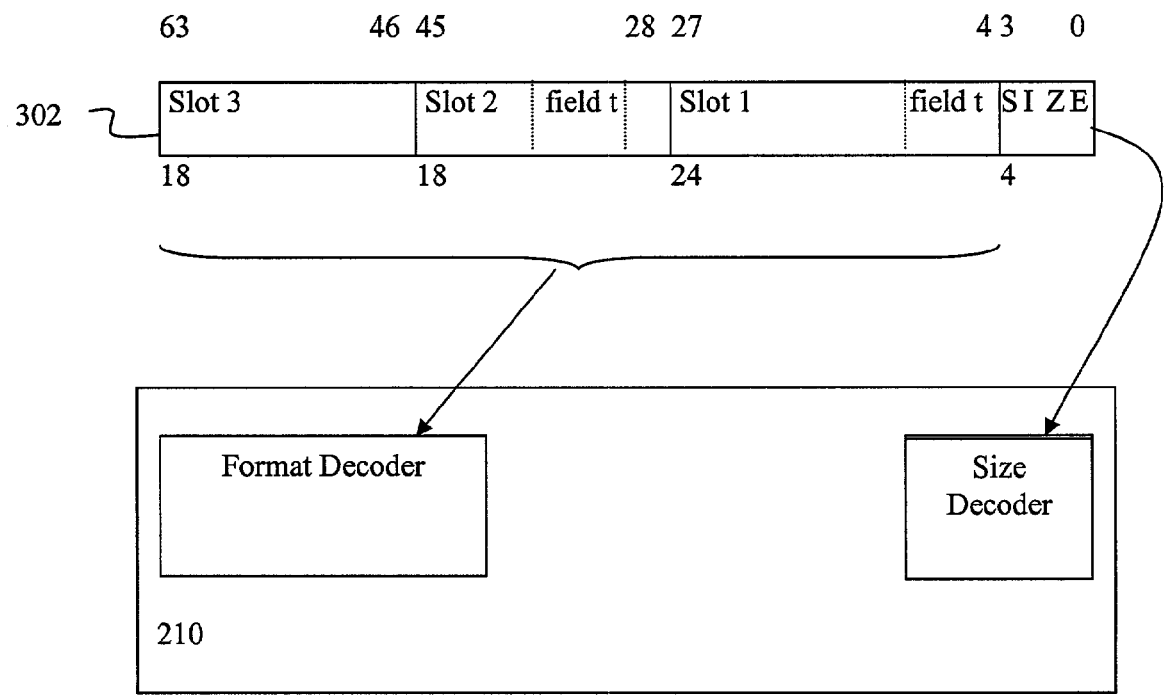
FIGS. 3A and 3B illustrate an example VLIW instruction format, and the associated decoding and execution logic, generated in accordance with an aspect of the invention.

An example VLIW instruction 302 in accordance with the invention is illustrated in FIG. 3A. In this example, the VLIW instruction is 64 bits. However, the invention is not limited to this size of VLIW instruction. It is advantageous for the instruction length to be determined from the least significant bits of the instruction for little-endian systems. For the example in FIG. 3, the least significant nibble (bits 0-3) of instruction 302 specifies the instruction length. For big-endian systems, the size specification is preferably in the most significant bits.

In a VLIW instruction set according to one example of the invention, an operation (op) is a computational task to be performed by an execution unit. As shown in FIG. 3, a VLIW instruction defined by the TIE of this invention includes a particular combination of slots, three in this example. Since there can be many instruction formats, a slot can belong to multiple formats. The slots in a VLIW instruction define separate pipelined execution units that operate independently. Nevertheless, an instruction slot can perform multiple ops and an op can belong to multiple slots.

As further shown in FIG. 3B, how TIE is used to define VLIW instructions and formats will lead to the production of customized hardware in the processor. For example, the definition of the size of the VLIW and other instructions will determine the structure of a length decoder 304 in instruction fetch unit 210. Further, the definition of the various instruction formats will lead to the generation of a particular format decoder 306 in instruction fetch unit 210. Finally, the set of operations defined for each slot will determine the structure of each separate pipelined execution unit 308 in VLIW co-processor 208.

Generally, the process of determining the set of operations for a VLIW instruction in a processor defined according to one example of the invention is shown in FIG. 4. As shown in FIG. 4, the beginning of the instruction is pointed to by the program counter (PC). The length (number of bits) of the next instruction is determined by looking at the value in the length-decoding bits (LD). In one example of the invention, value 14 in the LD field indicates that the length of the current instruction is 64 bits. A given format can be further decoded into several formats by looking at the value in the format-decoding bits (FD). In one example implementation, value 2 in the FD field indicates format f64b. Each format consists of a set of operation slots. Once the format is known, the slots can be extracted, the fields in the slots can be extracted, the opcodes can be decoded, and the operands can be computed. These are the basic steps for identifying the set of operations to be performed. The details of these steps are described in the subsequent sections.

The following sections describe the new TIE constructs for capturing VLIW instructions and for generating associated hardware descriptions and software tools.

An initial step in describing VLIW instruction extensions is to specify their length. In one example implementation, a new instruction length can be defined by the TIE statement:

length [i-name] [i-length] {expression} where i-name is a unique identifier that can be used to reference the length, i-length specifies the instruction length in bits, and expression is optionally used to specify decoding logic for determining the instruction length in the variable InstBuf. In one example implementation, i-length must be specified in multiples of 8 bits and only the least significant nibble (for little endian systems) is used in the expression.

Figure 5:
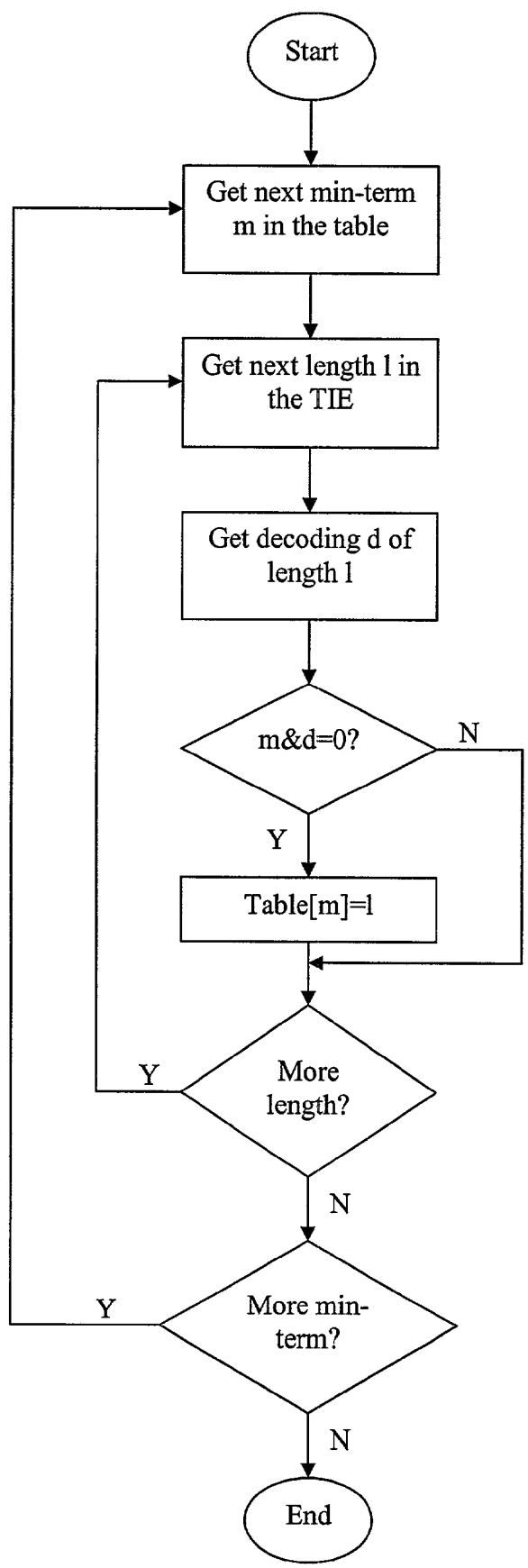
FIG. 5 illustrates a method for determining the length of a defined instruction.

When instruction length definitions have been included in the TIE program, the program is processed by the TIE compiler. The hardware logic and software tools generation functions in the TIE compiler share a common method. This method creates a length table mapping the min-terms in the length decoding fields to instruction lengths. Only the instruction bits referenced by the length expressions are relevant. The table contains an entry for every possible combination of values of these bits. These combinations of bit values are analogous to min-terms in a logic expression and they are treated as such by the TIE compiler. One way of generating the length table from TIE length statements is described in FIG. 5. For example if the TIE program contains the following length expressions:

length 124 24 {InstBuf[3]==0} length 116a 16 {InstBuf[3:2]==2'b10} length 116b 16 {InstBuf[3:1]==3'b110} length 164 64 {InstBuf[3:1]==3'b111}

The following length table will be generated:

| Instbuf[3:1] | Length name |
|---|---|
| 000 | l24 |
| 001 | l24 |
| 010 | l24 |

-continued

| Instbuf[3:1] | Length name |
|---|---|
| 011 | l24 |
| 100 | l16a |
| 101 | l16a |
| 110 | l16b |
| 111 | l64 |

Figure 6:
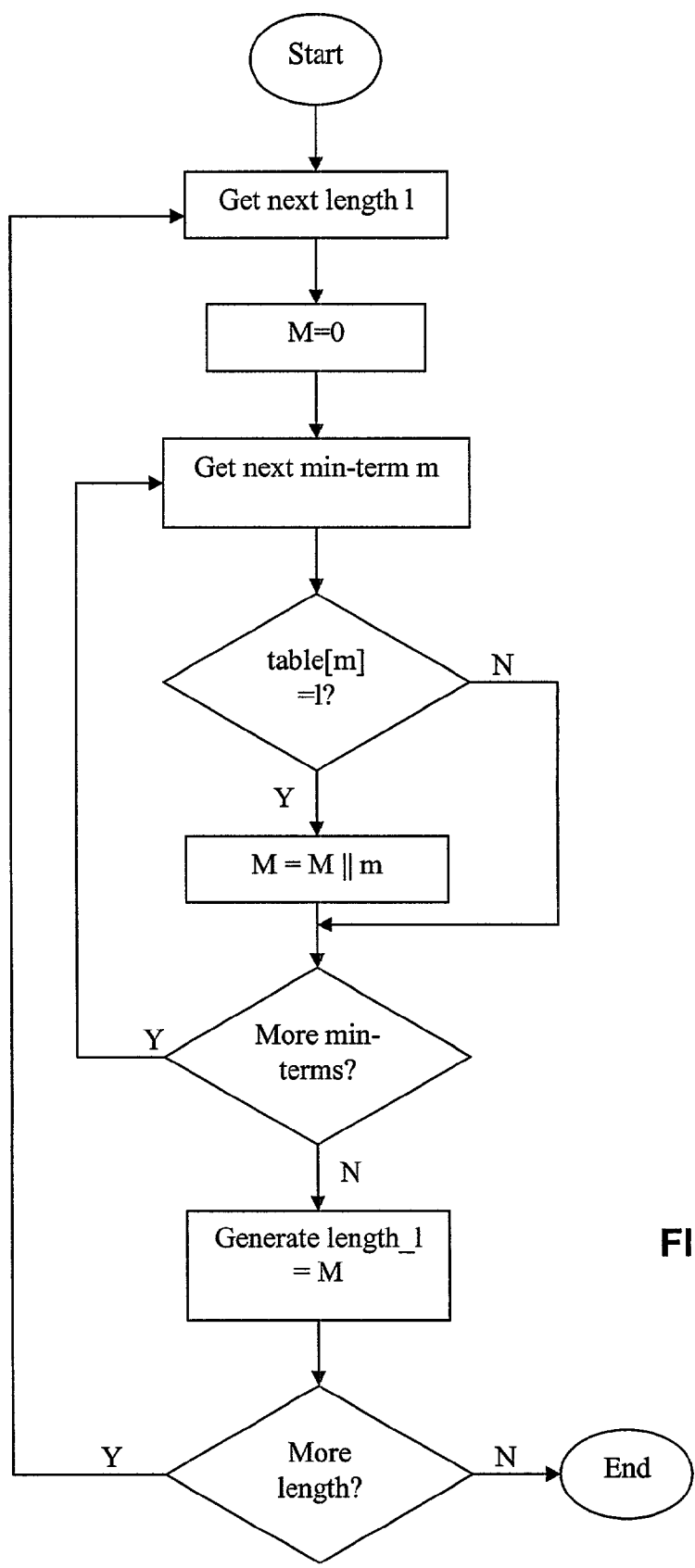
FIG. 6 illustrates a method for determining the decoding length for newly defined instructions.
Figure 7:
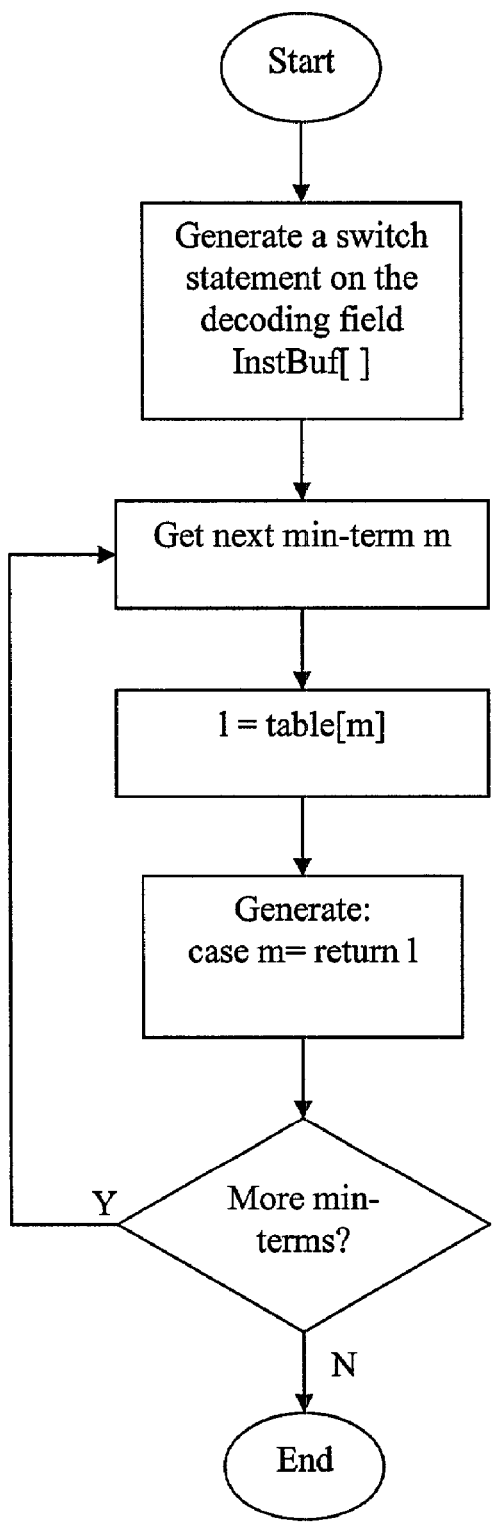
FIG. 7 illustrates a method for generating a length table according to the invention.

Using the length table constructed above, the hardware decoding logic can be constructed by the process described in FIG. 6. Using the above example, the generated hardware would look like length__24=InstBuf[3:1]==3'b000|InstBuf[3:1]
   ==3'b001 |InstBuf[3:1]==3'b010|InstBuf[3:1]
   ==3'b011;

length__16==InstBuf[3:1]==3'b100 |InstBuf[3:1]
   ==3b101 |InstBuf[3:1]==3'b110;

length__64==InstBuf[3:1]==3'b111;

Using the length table constructed above, the software decoding routine can be constructed by the process described in FIG. 7. Using the above example, the generated software decoding routine would look like:

```
switch (InstBuf[3:1]) {
  case 0: return 24;
  case 1: return 24;
  case 2: return 24;
  case 3: return 24;
  case 4: return 16;
  case 5: return 16;
  case 6: return 16;
  case 7: return 64;
}
```

It should be noted that in the above example, the decoding field is restricted to be 4-bits wide. This is a preferred embodiment that yields efficient hardware decoding logic. The general method, however, allows for any number of bits in the decoding logic, and the present invention includes such alternative embodiments.

It should be further noted that the above example puts restrictions on the decoding logic expression. Again, this is a preferred embodiment for efficient decoding logic. The general method allows for arbitrary specification of the decoding logic.

Figure 8:
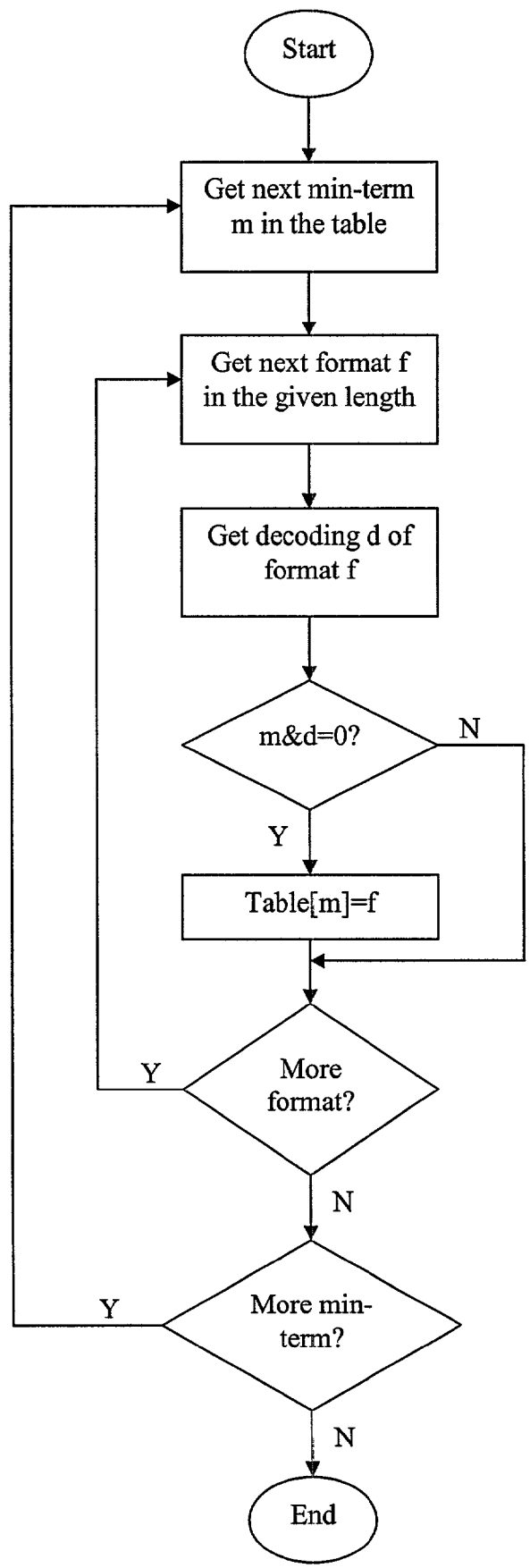
FIG. 8 illustrates a method for generating a format table according to the invention.

Another step in adding VLIW extensions is defining the format of such instructions. In one example implementation, the format of a new VLIW instruction can be defined using the following TIE statement:

format [name] [length] {decoding} where name is a unique identifier for the format, length is the name of a previously defined length, and the optional decoding is an expression to specify the decoding logic for the instruction format. When a TIE program is created containing such format statements, the hardware logic and software tools generation functions of the TIE compiler share a common method. It is to create a format table for each instruction length mapping the min-terms in the format decoding fields to instruction format code. The process for generating the format table from TIE format statements is described in FIG. 8. For example, if the TIE program contains the following format definitions:

format four_slots 164 {InstBuf[63]==1'b0} format three_slots 164 {InstBuf[63:62]==2'b10} format two_slots 164 {InstBuf[63:62]==2b11}

A format table such as the following is created for length 164:

| Instbuf[63:62] | format code |
|---|---|
| 00 | format_four_slots |
| 01 | format_four_slots |
| 10 | format_three_slots |
| 11 | format_two_slots |

Figure 9:
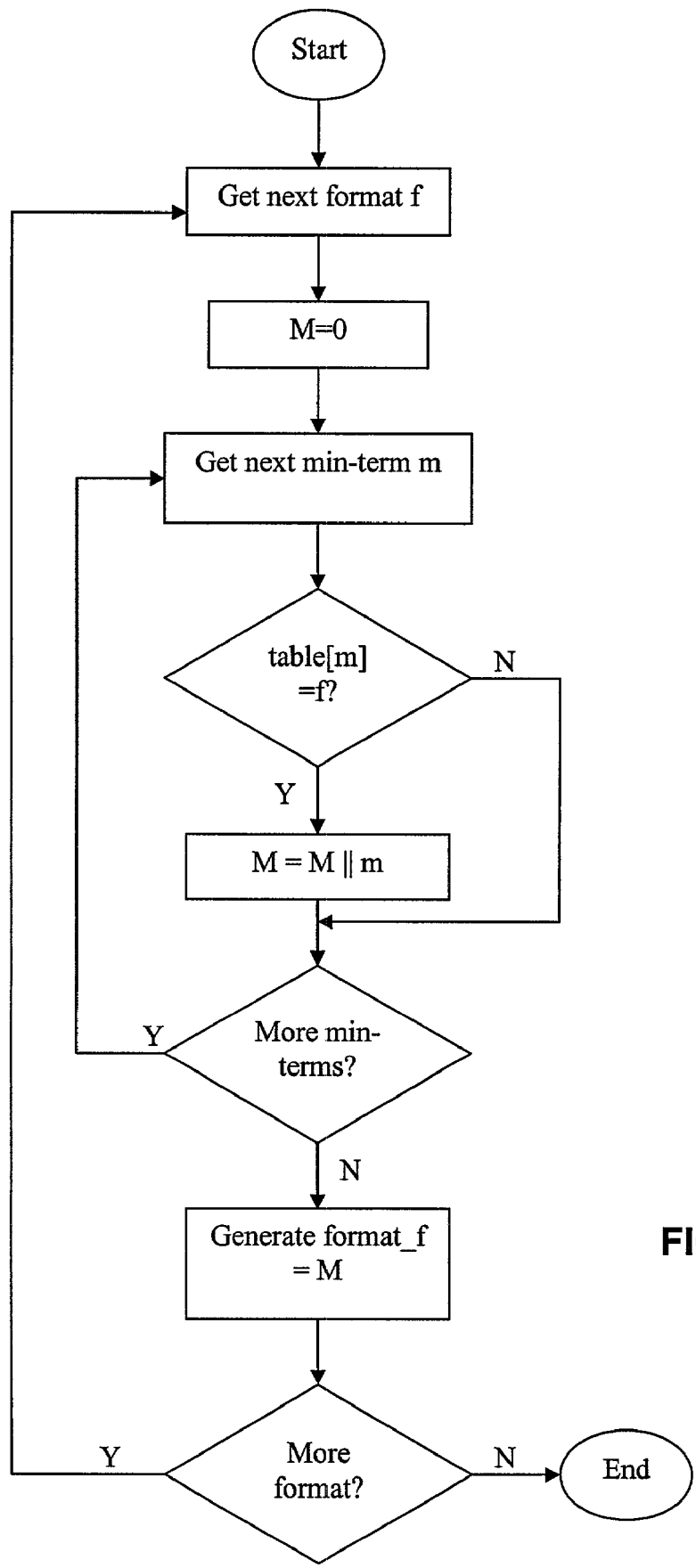
FIG. 9 illustrates a method for determining an instruction format table according to the invention.
Figure 10:
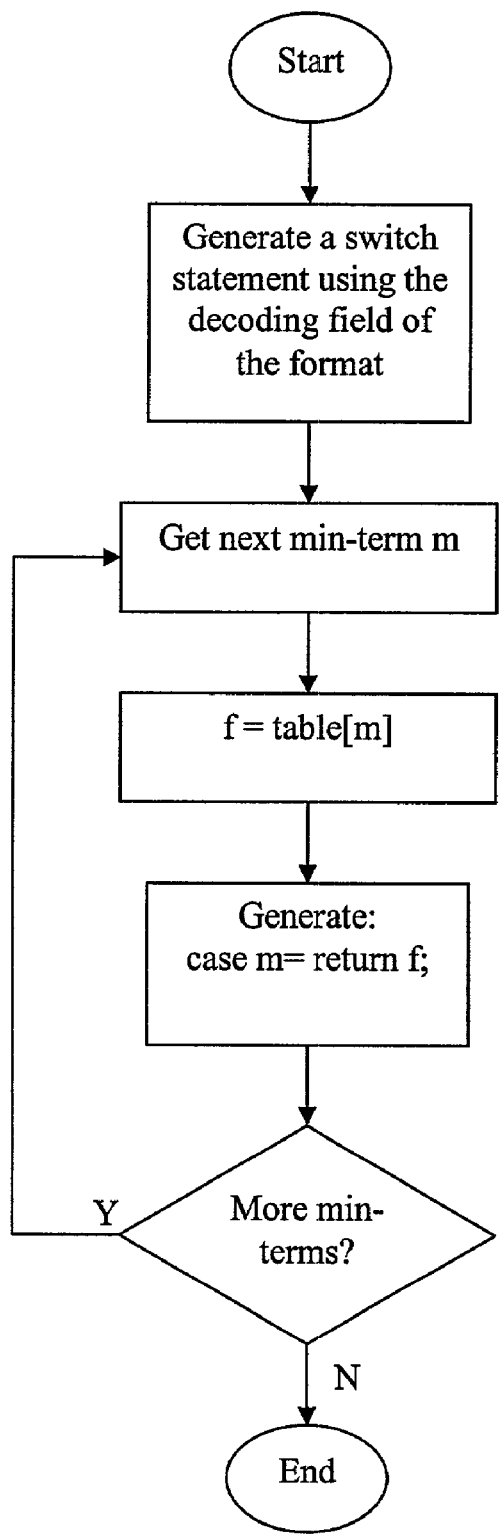
FIG. 10 illustrates a method for generating a software tool for a format table according to the invention.

Using the format code table constructed above, the hardware format decoding logic can be constructed by the process described in FIG. 9. Using the above example, the generated hardware would be format_four_slots=(InstBuf[63:62]==2'b00 |InstBuf[63: 62]=2'b01) & 164;
format_three_slots ==(InstBuf[63:62]==2'b10) & 164;
format_two_slots ==(InstBuf[63:62]==2'b11) & 164;

Using the format code table constructed above, the software format decoding routine can be constructed by the process described in FIG. 10. Using the above example, the generated software decoding routine would look like:

```
switch (InstBuf[63:62]) {
case 0: return format_four_slots;
case 1: return format_four_slots;
case 2: return format_three_slots;
case 3: return format_two_slots;
}
```

Another step in adding VLIW extensions is defining the format of an operation slot. In one example implementation, the format of a new operation slot for a VLIW instruction can be defined using the following TIE statement:

slot [name] [format-name[index:index]]

where name is a unique identifier for the slot, and format-name is the name of a previously defined format. The bit indices should be valid indices of the format, i.e., they must be within the instruction length for the format. Although a slot name can be defined multiple times, in the same or different formats, all definitions contain the same number of bits.

When a TIE program is created containing such slot statements, the hardware logic and software generation functions of the TIE compiler will generate logic capable of extracting the slots. For example, the TIE program can include the following statements:

length 164 64 {InstBuf[3:0]==15}
format f64 164
slot alu {f64[23:4], f64[27:24]}
slot mac f64[43:28]
slot s1 f64[53:44]
slot s1 f64[63:54]

In the hardware implementation, it is often convenient to use a variable to represent the contents of a slot. The value of the slot variable is derived directly from the definition. Using the above example, let slot_alu be the variable for the alu slot, the HDL statement would look like assign slot_alu={InstBuf[23:4], InstBuf[27:24]};

This HDL is produced from the TIE slot statement by simply replacing the format name (e.g., "f64") with the instruction buffer ("InstBuf").

In software tools, it is also useful to use one variable to represent the contents of a slot. Using the same example and letting slot_alu be the variable for the alu slot, the C statement would look like slot_alu=InstBuf & 0xffff0 |(InstBuf >>24) & 0xf;

(Generating a sequence of shift and mask operations in C to extract and combine the slot fields is straightforward and the method should be readily apparent.)

A next step in adding VLIW extensions is defining fields for operation slots. In one example implementation, the format of a new operation slot for a VLIW instruction can include fields, and fields can be used in different slots. A new operation field can be defined using the following TIE statement:

field [name] [field-name[index:index] or slot-name[index:index]]

where name is a unique identifier for the field, and field-name and slot-name are the names of a previously defined field or slot, respectively. The bit indices are relative to the field or slot, not absolute within the instruction buffer, and should be valid indices of the field or slot.

When a TIE program is created containing such field statements, the hardware logic and software generation functions of the TIE compiler will generate logic capable of extracting the fields. In particular, the TIE compiler will determine the slot sets for each created field. The slot set for a field is the set of slots containing that field. For example, the TIE program can include the following statements:

| field f1 s1[3:0] | // s1 is a slot |
|---|---|
| field f1 s2[4:1] | // s2 is a slot |
| field f2 s1[7:4] | // s1 is a slot |
| field f2 s3[2:0] | // s3 is a slot |
| field f3 {f2[0], f1} | |

The compiler will then generate the following slot sets:
slot set of f1: {s1, s2}
slot set of f2: {s1, s3}
slot set of f3: {s1} (i.e., field f3 is only defined in slot s1)

Another step in adding VLIW extensions is defining opcodes. In one example implementation, a new opcode for a VLIW instruction can be used in different slots. A new opcode can be defined using the following TIE statement:

opcode [name] [field-name=sized constant]

where name is a unique identifier for the opcode, and field-name is the name of a previously defined field. Preferably, the instruction extensions are defined as sub-opcodes of the CUST0 or CUST1 predefined opcode names with the exception of user-defined load and store instructions.

When a TIE program is created containing such opcode statements, the hardware logic and software generation functions of the TIE compiler will generate decoder logic capable of recognizing the opcodes. As one aspect of this, the TIE compiler will determine the slot sets for each created opcode, where the slot set for an opcode is the set of slots containing the fields that specify that opcode. For example, the TIE program can include the following statements:

```
field f1 s1[3:0]      // s1 is a slot
field f1 s2[4:1]      // s2 is a slot
field f2 s1[7:4]      // s1 is a slot
field f2 s3[2:0]      // s3 is a slot
opcode o1 f1=3
opcode o2 f2=0 o1
```

The following slot sets will then be determined.
  slot set of f1: {s1, s2}
  slot set of O1: {s1, s2}
  slot set of f2: {s1, s3}
  slot set of o2: s1

As can be seen, Opcode o1 is defined in both slot s1 and s2. Opcode o2 is only defined in slot s1.

Instruction (operation) classes, which associate opcodes with operands, are defined with TIE iclass statements. The set of slots in which an iclass is defined is referred to as the slot-set of the iclass. Since an iclass is defined in terms of opcodes and operands, the slot set for the iclass may not be directly obvious. An example method for determining the slot-set of an iclass is determining the intersection of the slot-sets for all the opcodes and the slot sets of the fields used by operands in the iclass definition.

Given the slot set of each iclass, the method of generating the decode logic to identify the opcode in each slot is the same as the method described in the aforementioned applications. As with the TIE description in the afore-mentioned applications, the iclass, semantic and reference definitions for the opcode will determine the behavior of an instruction including the opcode, and thus the hardware and software associated with the execution unit for the VLIW slot-sets determined for the opcode.

Referring back to FIG. 2, and as more fully explained in co-pending application Ser. No. 10/146,651, another aspect of the present invention is the ability to operate with a configurable number of load/store units. A further aspect is to provide an enhanced interface to the load/store units. To allow multiple load/store instruction extensions to share certain common logic, the present invention adds some new construct to the TIE language. The definition and usage of these constructs are described hereinbelow.

Using the processor generation system of the prior patent and applications, a load instruction reads the entire word (multiple bytes) from the memory. There was no way to read a subset of bytes in the word without reading the rest. For certain memory-mapped devices, reading a value effectively removes the data from the device. For such devices, reading unwanted data (bytes) is very un-desirable and could cost a great deal of additional hardware to work around the problem. Likewise, a store instruction in the prior system always writes the entire word into the memory. Writing only a subset of bytes in the word was not possible. The present invention provides a general way for specifying the individual bytes to be read or written during a load or store operation, through the use of newly-provided LoadByteDisable and StoreByteDisable interface signals.

Figure 11:
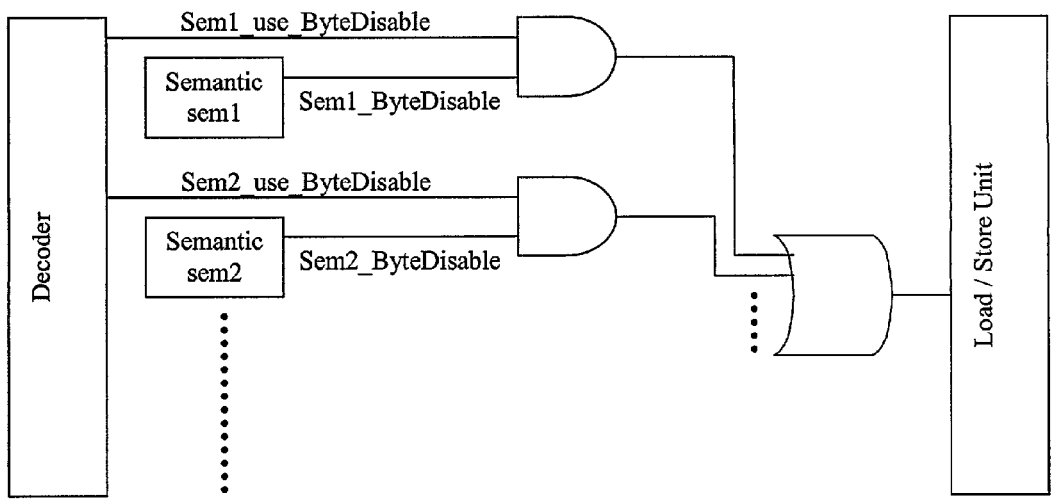
FIG. 11 illustrates providing byte disable logic for a load/store unit in accordance with the invention.

With this scheme, the byte-disable logic is implemented once in the load/store unit and shared among all load/store instructions, including all processor core 202 instructions as well as all user-defined TIE datapath 204 instructions. FIG. 11 shows how to combine different load/store instruction semantics to produce shared load-byte-disable and store-byte-disable signals for the common load/store unit.

In another example limitation of the prior system, the data read from the memory is rotated in a particular way, according to the low-order bits of the virtual address from which the data is read. The data written to the memory is not rotated at all. If a load or a store instruction requires the data to be rotated in some other way, additional logic must be used. The present invention provides a more general way of specifying the rotate amount for the read and write data, eliminating the need to have extra rotating logic in the individual instruction semantic logic and allowing multiple instructions to share the rotation logic.

Figure 12:
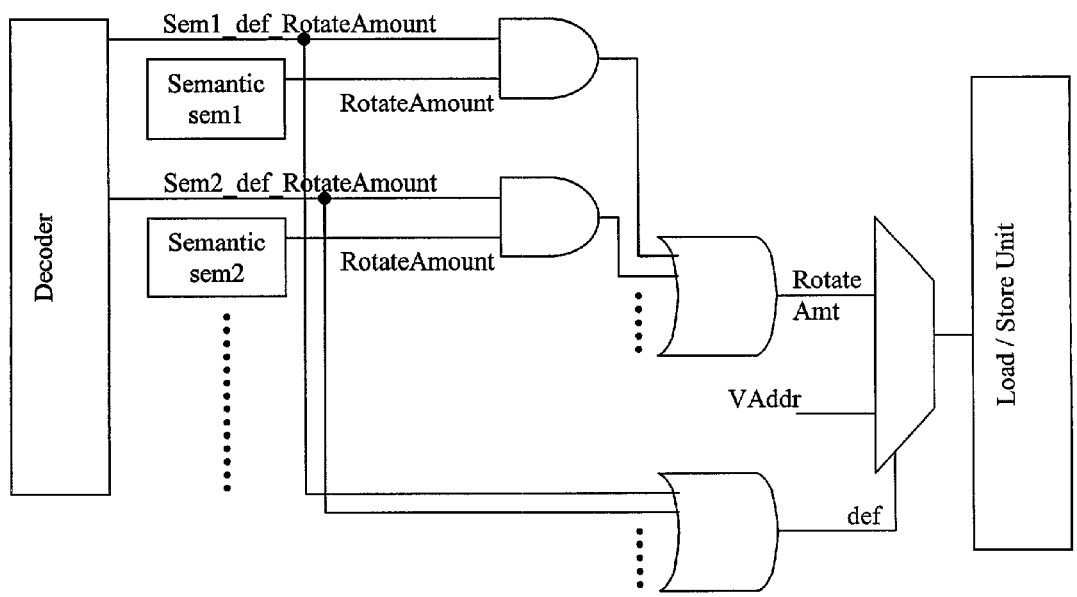
FIG. 12 is a block diagram illustrating rotation logic for a load/store unit in accordance with the invention.

This new capability is provided with the RotateAmount interface signal. With this scheme, the rotation logic is implemented once in the load/store unit and shared among all load/store instructions, including all processor core 202 instructions as well as all user-defined TIE instructions. FIG. 12 shows how to combine different load/store instruction semantics to produce a single shared rotate-amount signal for the common load/store unit.

As another example, for many load instructions dealing with signed data, it is common to perform sign extension on the data read from the memory. Using the prior system, this can be done in the instruction semantics. However, the sign extension logic typically involves replicating the sign bit many times, therefore increases the output loading of the sign bit and potentially makes it the critical timing path in the semantic logic. Co-pending application Ser. No. 10/146, 651 describes a way to perform this sign extension by moving the operation off the critical timing path in the load/store unit. The present invention provides a way for user-defined instructions to use the sign-extension logic in the load/store unit instead of in the instruction semantics, avoiding potential timing problems in the design. To capture the sign-extension requirement, the present invention adds two new signals to the TIE language, SignExtendFrom and SignExtendTo. SignExtendFrom specifies the position of the byte containing the sign bit, which typically is the most significant of the load data. SignExtendTo specifies the position of the most significant byte in the sign-extended data. For example, if the read data is 8'b10001111, SignExtendFrom is 1 and SignExtendTo is 2, the extended data would be 16'b1111111110001111.

With this new capability, the user TIE instruction can load sign-extended data from memory without any extra hardware. The following is an example of how to use this feature:

```
interface SignExtendFrom 5 core out
interface SignExtendTo 5 core out
iclass sign_load {SL}
    {out art, in ars, in imm8} { }
    {out SignExtendFrom, out SignExtendTo, in MemDataIn32, out
     VAddr}
reference SL {
    assign VAddr = ars + imm8;
    assign SignExtendFrom = 5'd2;
    assign SignExtendTo = 5'd4;
    assign art = MemDataIn32;
}
```

This description specifies a sign-extended load instruction that reads 16-bit data from memory location specified by "ars+imm8", sign-extended it to 32 bits, and put the sign-extended data to "art".

In almost all applications, there are load/store operations performed only when certain conditions are met. Doing the conditional load/store operations using multiple instructions is often inefficient. For example, the following code sequence:

```
if (cond) {
    x = load(addr);
}
``` will typically result in several instructions: evaluating the condition, branch, and load. Further inefficiency comes from the extra delay associated with typical branch instructions. It is desirable to compute this task in a single instruction that can conditionally load the data. However, in the prior system, if a load or a store instruction is issued, there was no way to cancel the load or store operation, making it impossible to implement a conditional load/store instruction. The present invention makes this possible through the use of LoadByteDisable and StoreByteDisable interface signals described earlier. The definition of LoadByteDisable/StoreByteDisable specifies that if all bytes are disabled the associated load/store operations are canceled. The following example illustrates how to use this feature:

```
interface LoadByteDisable 5 core out
iclass cond_load {CL}
    {out art, in ars, in imm8} {in cond}
    {out LoadByteDisable, in MemDataIn32, out VAddr}
reference SL {
    assign VAddr = ars + imm8;
    assign art = MemDataIn32;
    assign LoadByteDisable = {5{VAddr[0] == 1'b1}};
}
```

This description implements a load instruction that conditionally loads the data when the address is even.

Allowing multiple parallel operations performed by an instruction is a key to increasing the system performance. The VLIW architecture supported by this invention does this by providing multiple operation slots in an instruction as described above. This makes it possible to perform several memory operations concurrently. Co-pending application Ser. No. 10/146,651 describes the implementation of multiple load/store units. The present invention adds additional capability in TIE for user to associate a load/store instruction with a specific load/store hardware unit. Furthermore, the present invention provides a method for specifying a load/store instruction independent of any particular load/store units and a method for automatically mapping the unit-independent operations to the available hardware load/store units.

Figure 13:
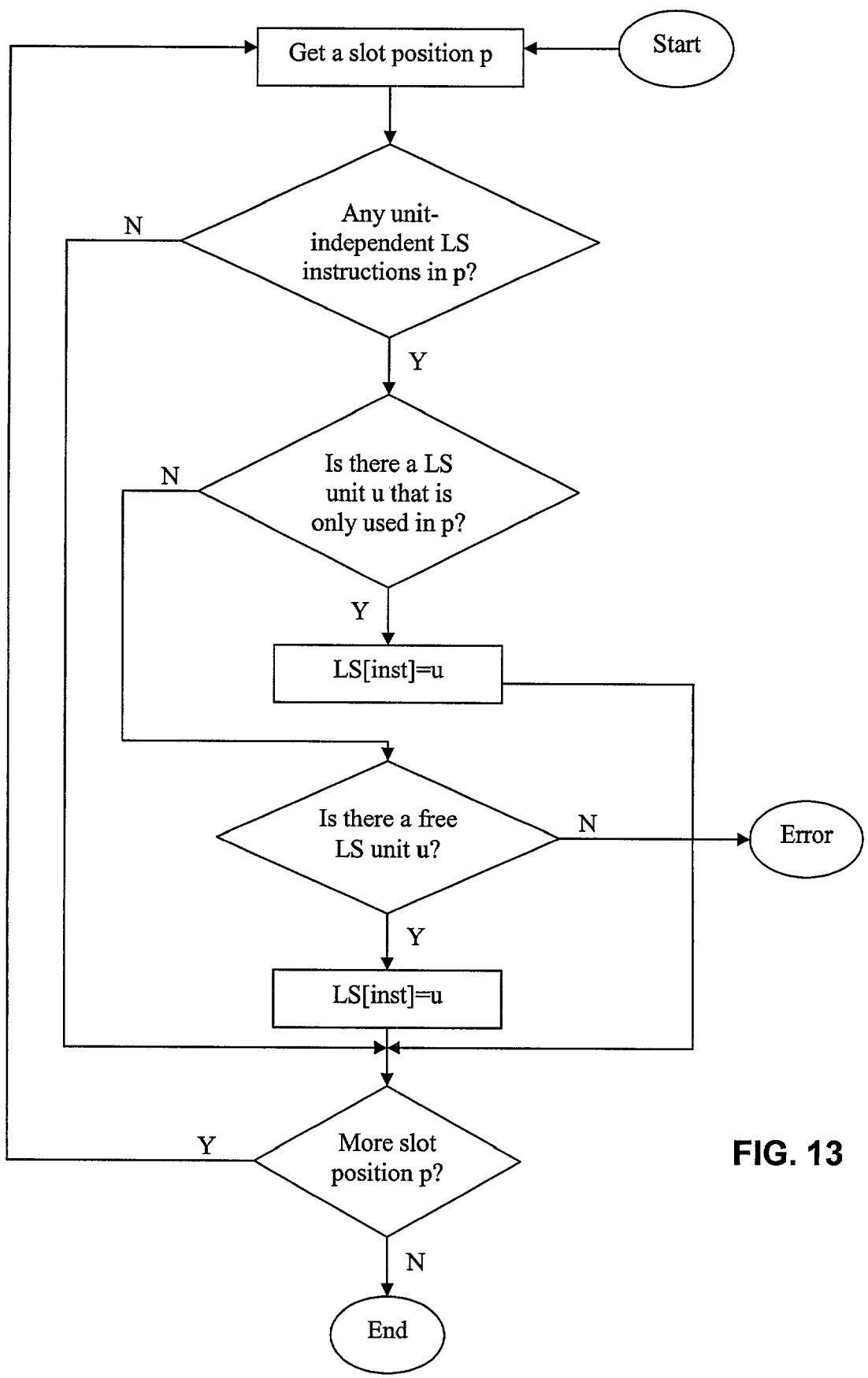
FIG. 13 illustrates a method for associating a load/store unit with an instruction according to the invention.

For any load/store operations specified using unit-independent memory interfaces, an automatic procedure can be used to assign the operations with specific hardware load/store units to optimize certain criteria, such as the total number of units required, or the maximum application performance. One preferred embodiment is illustrated in FIG. 13. The process of assigning a load/store unit to a unit-independent load/store operation starts by looking for a load/store unit that is already used in the same slot position of that instruction. Since each slot position can issue no more than one op per cycle, such an assignment will not result in any resource (load/store units) contention. If such a load/store unit cannot be found, the assignment process looks for a load/store unit that is not used anywhere. When the second step fails, the process issues an error message to the user.

Referring back to FIG. 2, another aspect of the present invention is the ability to define shared functions. In the prior processor generation system, the semantics of TIE instructions are expressed as a collection of assignments of variables with logic expressions. Even though this was sufficient for specifying any instruction semantics, there was no way of expressing common computational procedures among a group of instructions. As an example, the following is the semantic description of two TIE instructions Load and Store:

```
reference Load {
    wire [31:0] buf;
    assign VAddr = ars + imm8;
    assign buf = MemDataIn32;
    assign art = swap? {buf[7:0], buf[15:8], buf[23:16], buf[31:24]} : buf;
}
reference Store {
    wire [31:0] buf;
    assign VAddr = ars + imm8;
    assign buf = swap? {art[7:0], art[15:8], art[23:16], art[31:24]} : art;
    assign MemDataOut32 = buf;
}
```

The "Load" instruction loads 32 bits from memory and conditionally swap the bytes depending on the value of the state register "swap". Likewise, the "Store" instruction stores 32 bits to memory before conditionally swap the bytes depending on the value of the state register "swap". The byte swapping computation is present in both semantics, but have to be specified twice. Using TIE function construction, this description can be made more structured and understandable as follows:

```
function [31:0] byteswap(S, [31:0] D) {
    assign byteswap = S ? {D[7:0], D[15:8], D[23:16], D[31:24]} : D;
}
reference Load {
    assign VAddr = ars + imm8;
    assign art = byteswap(swap, MemDataIn32);
}
reference Store {
    assign VAddr = ars + imm8;
    assign MemDataOut32 = byteswap(swap, art);
}
```

The TIE function construct of the present invention is even useful to structure a single instruction semantics when it performs the same computations several times in parallel. In the following example, the instruction addsub4×8 performs two 8-bit additions or subtractions depending on the value of the state register "sub".

```
semantics addsub4×8 {addsub4×8} {
    wire [7:0] t0 = ars[7:0] + (sub ? ~art[7:0] : art[7:0]) + sub;
    wire [15:8] t1 = ars[15:8] + (sub ? ~art[15:8] : art[15:8]) + sub;
    wire [23:16] t2 = ars[23:16] + (sub ? ~art[23:16] : art[23:16]) + sub;
    wire [31:24] t3 = ars[31:24] + (sub ? ~art[31:24] : art[31:24]) + sub;
    assign arr = {t3, t2, t1, t0};
}
```

Clearly, the 8-bit addsub unit is specified four times. Using the new TIE function construct of this invention, the same description can be made more structured and more understandable as:

```
function [7:0] addsub8(sub, [7:0] a, [7:0] b) {
    assign addsub8 = a + (sub ? ~b : b) + sub;
}
semantics addsub4x8 {addsub4x8} {
    wire [7:0] t0 = addsub8(sub, ars[7:0], art[7:0]);
    wire [15:8] t1 = addsub8(sub, ars[15:8], art[15:8]);
    wire [23:16] t2 = addsub8(sub, ars[23:16], art[23:16]);
    wire [31:24] t3 = addsub8(sub, ars[31:24], art[31:24]);
    assign arr = {t3, t2, t1, t0};
}
```

The prior processor generation system allows for several instruction semantics to share common hardware. But in order to achieve the sharing, the user has to merge the description of the instructions into a single semantic section and specify the sharing manually. For example, let ADD2, ADD3, and ADD4 be three instructions which add two, three, or four numbers. Using prior art invention, the description would look like:

```
semantic add {ADD2, ADD3, ADD4} {
    assign sum = D0 + D1 + (ADD2 ? 0 : D2) +
        ((ADD2|ADD3) ? 0 : D3);
}
```

Using the shared function construct of this invention, the instruction semantics can be specified separately as

```
function [31:0] a4([31:0] d0, [31:0] d1, [31:0] d2, [31:0] d3) shared {
    assign a4 = d0 + d1 + d2 + d3;
}
semantic add2 {ADD2} {
    assign sum = a4(D0, D1, 0, 0);
}
semantic add3 {ADD3} {
    assign sum = a4(D0, D1, D2, 0);
}
semantic add4 {ADD4} {
    assign sum = a4(D0, D1, D2, D3);
}
```

Figure 14:
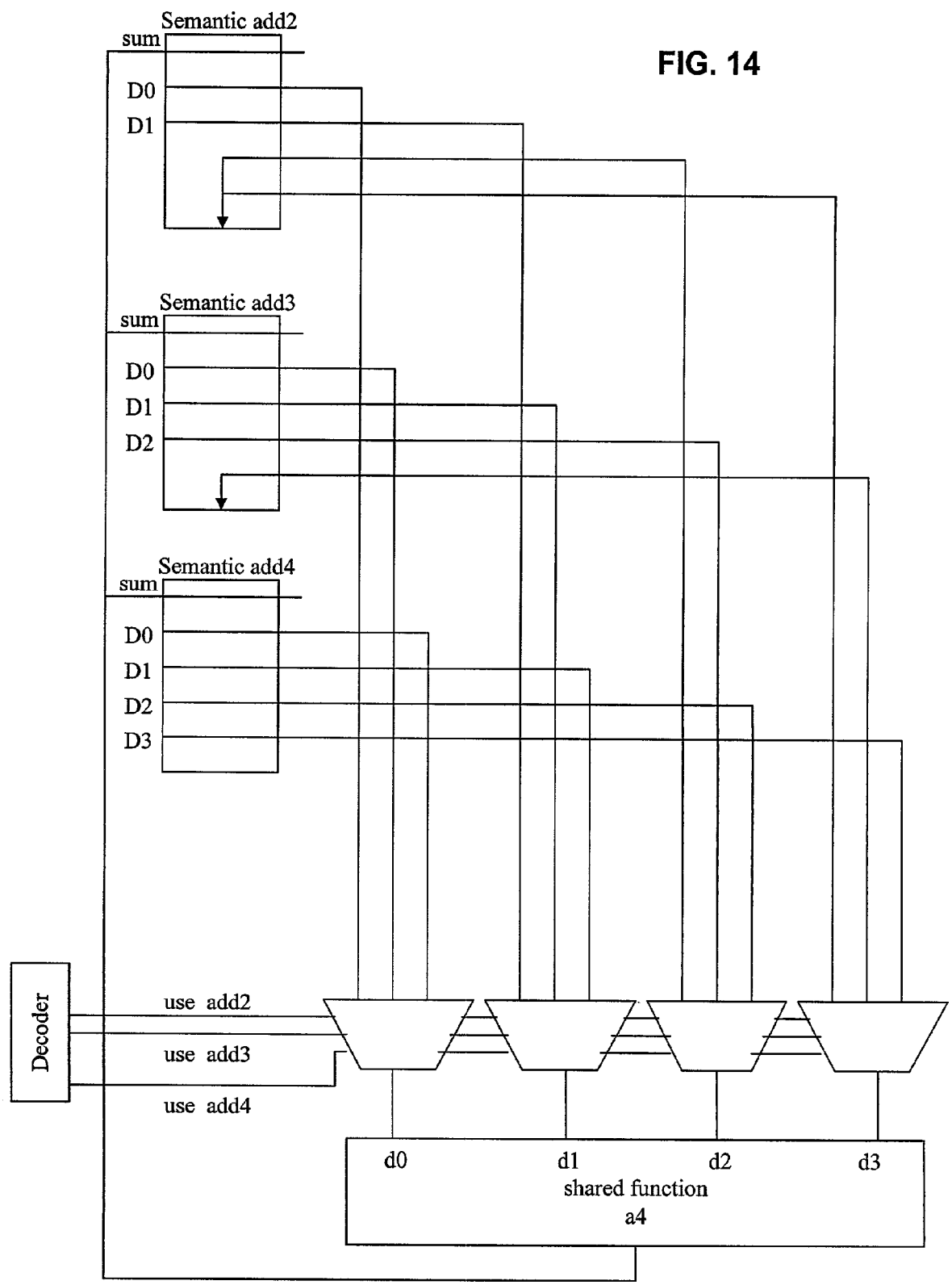
FIG. 14 illustrates providing a shared function in accordance with the invention.

Unlike software, hardware description language does not offer a direct way for two different modules to share a logic block. This invention provides a process by which the TIE compiler can automatically generate the RTL implementation for multiple semantic modules to share a function. The process involves the following steps:

(1) create a module for the shared function
(2) create a wrapper module for the shared function module
(3) for each input of the shared function
    (a) create a mux with N inputs where N is the number of semantic modules using the shared function
    (b) feed the output of the mux to the shared function
(4) for each semantic module using a shared function
    (a) create an output for each input of the shared function
    (b) create an input for the output of the shared function
    (c) feed the semantic outputs to the wrapper module as inputs
    (d) feed the wrapper module output to the semantics as an input
(5) create in the decoder one signal for caller of the shared function and pass the signals to the wrapper module
(6) use the decoding signals to select the appropriate inputs in the wrapper module Using this process, generated RTL for the above example is shown in FIG. 14.

The shared function in the present invention provides TIE with the capability of describing an instruction that uses a hardware computational unit several times (thus the term iterative instruction). This was not possible in the prior generation system. With this feature, the computational hardware would have to be replicated multiple times, resulting in extra hardware cost. For example, if one wanted to implement an instruction that does two 16-bit multiplications, using the prior system, the only way to do this is to use two 16-bit multipliers, as illustrated in the following description:

```
semantics mul2 {MUL2} {
    wire [15:0] lo = ars[15:0] * art[15:0];
    wire [15:0] hi = ars[31:16] * art[31:16];
    assign arr = {hi, lo};
}
```

Using TIE shared function construct of the present invention, the instruction can be described using:

```
function [15:0] mul16([15:0] a, [15:0] b) shared {
    assign mul16 = a * b;
}
semantics mul2 {MUL2} {
    wire [15:0] hi = mul16(ars[31:16], art[31:16]);
    wire [15:0] lo = mul16(ars[15:0], art[15:0]);
    assign arr = {hi, lo};
}
schedule mul2_sch {MUL2} {
    def arr 2;
}
```

Figure 15:
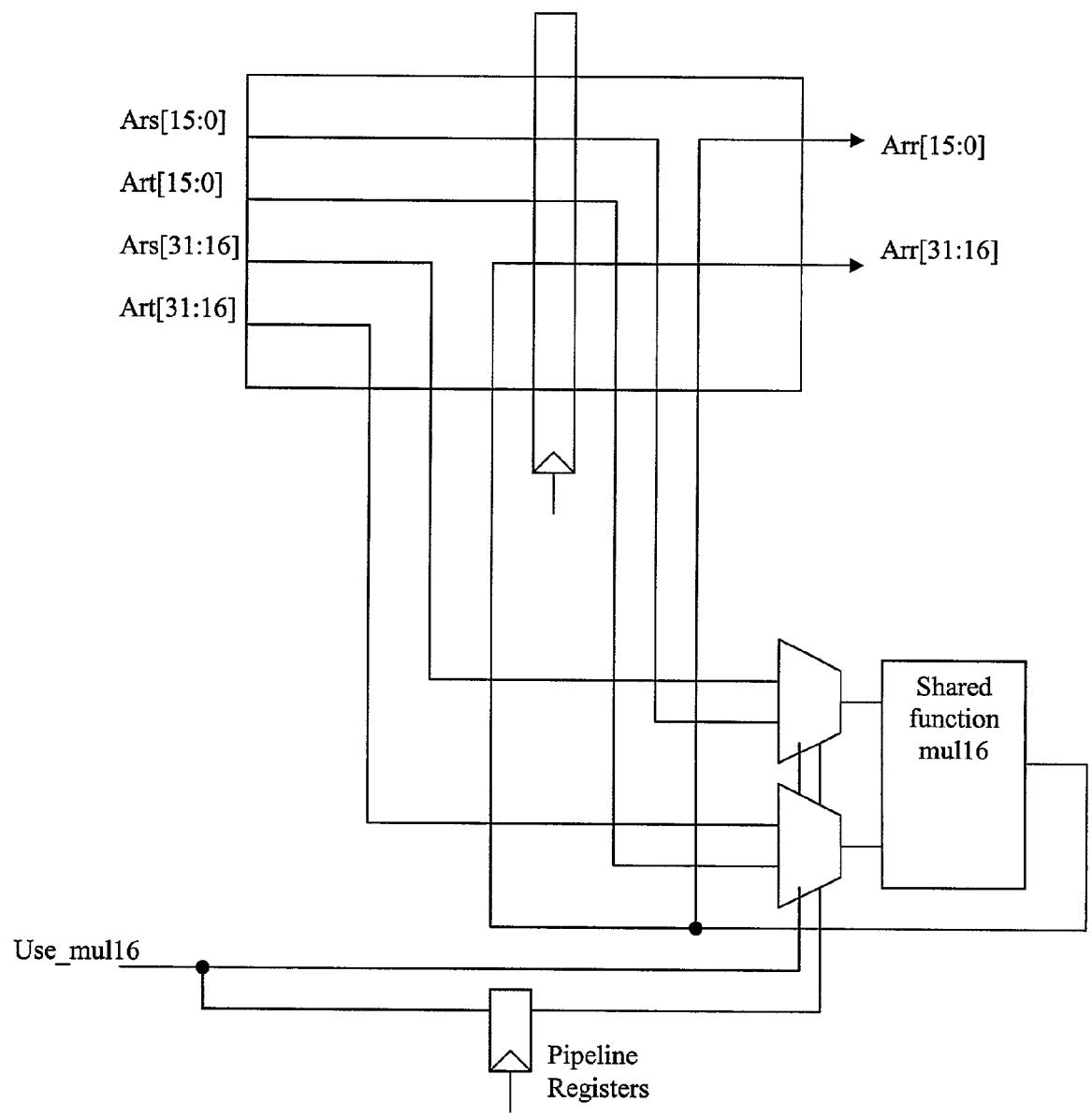
FIG. 15 illustrates an example of a shared function performing an iterative instruction in accordance with the invention.
Figure 16:
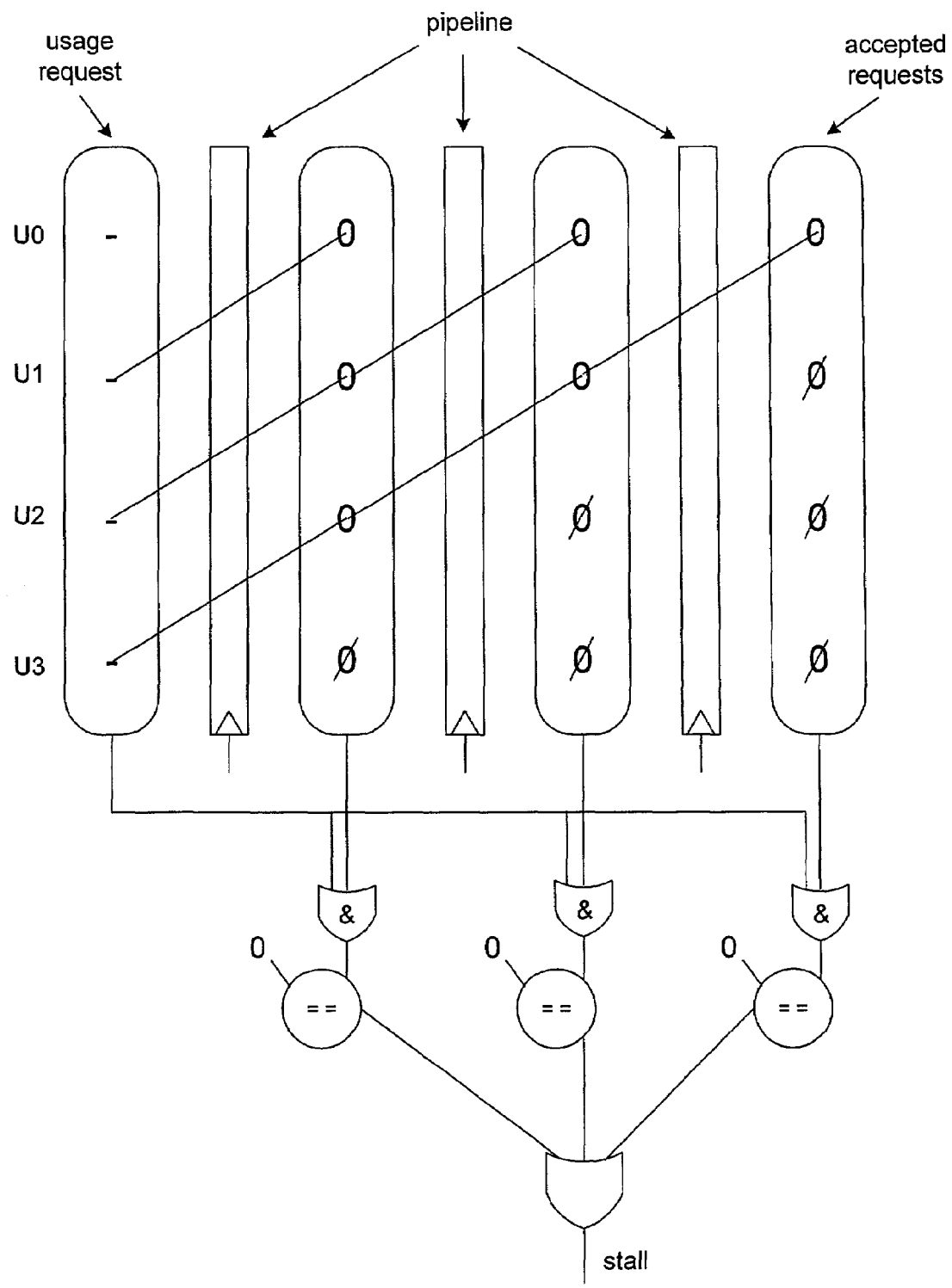
FIG. 16 illustrates pipeline stall logic useful in accordance with a processor of the invention.

With this description, the 16-bit multiplier is only implemented once in hardware and used twice during the single execution of the instruction MUL2. The RTL implementation of using a shared function several times in a single iterative instruction is very similar to using a shared function in several different instructions. FIG. 15 shows the RTL structure for the above example. Since an iterative instruction uses a shared function in multiple cycles, it is important that the instruction issuing logic understands the resource constraints imposed by the use of shared functions. In particular, the processor needs to be stalled whenever such a resource conflict is detected. Using the previous example, if the program has a back-to-back MUL2 instructions, the second one must be stalled for one cycle. Without the stall, the processor would see the first MUL2 in stage 2 and the second in stage 1, both trying to use the shared function mul16 at the same time. To inform the processor of any up-coming resource contentions, each shared function generates a stall signal that tells the processor control whether the current instruction needs to be stalled. There can be any number of ways of implementing the stall logic. In one embodiment, the shared function RTL provides an interface to take as an input a usage request and tells the processor control whether the request can be granted (i.e., yes when the stall signal is true). Internally, it keeps all of the previously accepted and unfinished requests and uses them to compare with any new request. FIG. 16 shows the stall logic for a shared function that is to be used in 4 different cycles by various instructions.

As set forth above in reference to FIG. 2, another aspect of the present invention is more efficient and more flexible use of register files. The register operand of an instruction specifies which register in the register file is to be used as the input or output for the computation. In the prior processor generation system, there was only one way of specifying the register operand: to encode the actual register number in the register operand field of the instruction. For example, the following is a TIE description for a register operand using prior art invention:

```
operand art t {AR[t]}
```

This register operand definition specifies that the actual register number in the AR register file is the value stored in the instruction field "t". The present invention provides a much more general way of specifying register operands.

An important aspect of increasing the amount of computation performed by an instruction is to increase the number of input and output data. However, due to the limited number of bits in an instruction, there is a limit as to how many register operands can be used by an instruction. This invention provides a way for a single register operand to specify multiple adjacent registers in the register file. This new capability is based on an enhanced register file and register operand description. An example description would be:

```
regfile INT8 8 16 s INT16=2 INT32=4
```

Figure 17:
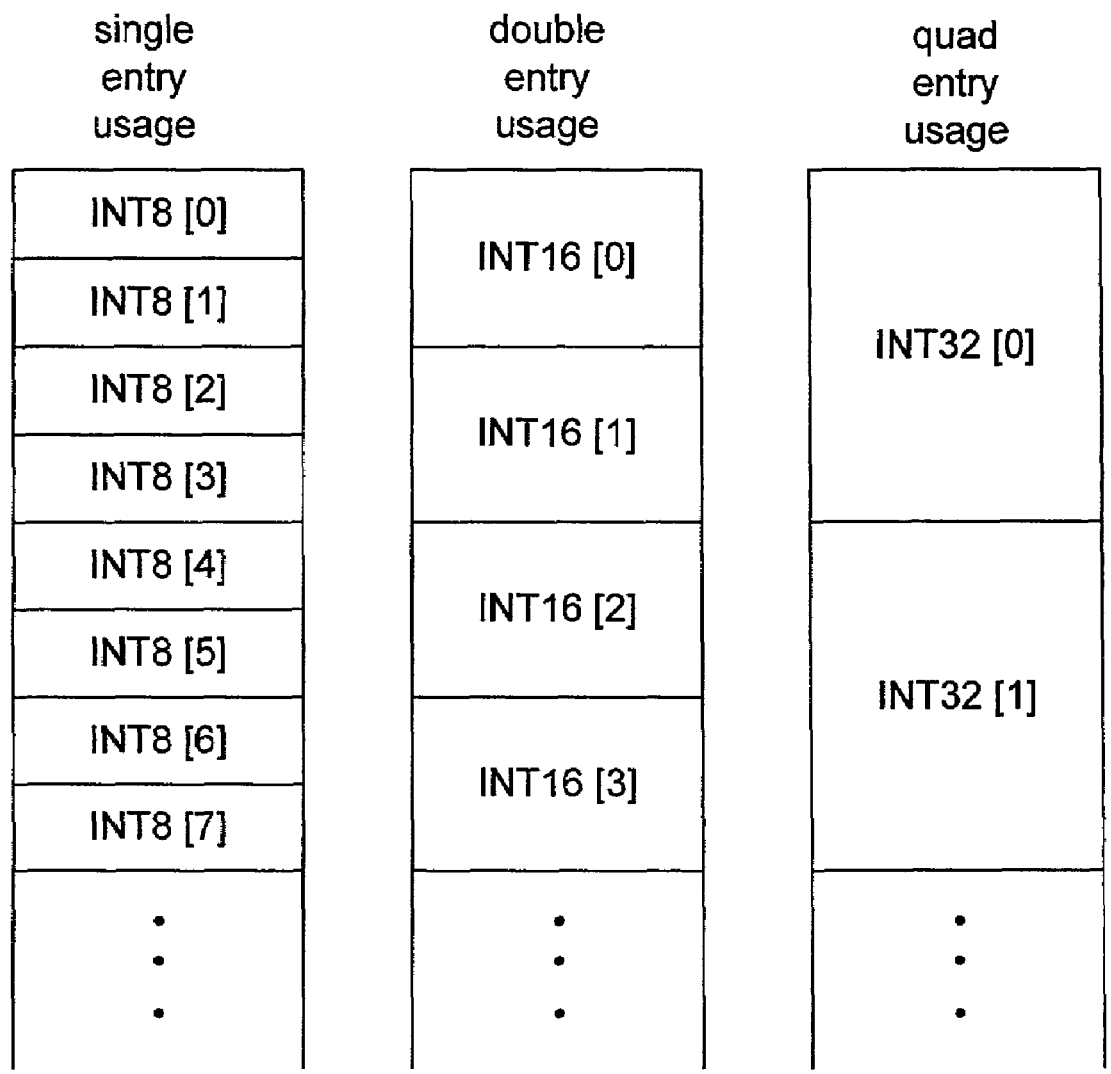
FIG. 17 illustrates enhanced operand register file semantics according to the invention.

This example of TIE code declares a register file INT8 for holding 16 8-bit integers. When every two entries are grouped, the register file can be used to hold 8 16-bit integers. When every four entries are grouped, the register file can be used to hold 4 32-bit integers. FIG. 17 shows this register file with multiple usages.

There are two ways of using this new capability to increase the computational efficiency of an instruction. The first is to group several adjacent registers together as a way of passing more data to and from the instruction semantics (the computational logic). This is illustrated with the following example:

```
regfile RFS 32 16 r RFD=2 RFQ=4
field rd r[3:1]
field sd s[3:1]
field td t[3:1]
field rq r[3:2]
field sq s[3:2]
field tq t[3:2]
operand rfss s {RFS[s]} /* single entry operand */
operand rfst t {RFS[t]} /* single entry operand */
operand rfsr r {RFS[r]} /* single entry operand */
operand rfds sd {RFD[sd]} /* double entry operand */
operand rfdt td {RFD[td]} /* double entry operand */
operand rfdr rd {RFD[rd]} /* double entry operand */
operand rfqs sq {RFQ[sq]} /* quad entry operand */
operand rfqt tq {RFQ[tq]} /* quad entry operand */
operand rfqr rq {RFQ[rq]} /* quad entry operand */
iclass adds {ADDS} {out rfsr, in rfss, in rfst}
iclass addd {ADDD} {out rfdr, in rfds, in rfdt}
iclass addq {ADDQ} {out rfqr, in rfqs, in rfqt}
reference ADDS {
    assign rfsr = rfss + rfst;
}
reference ADDD {
    wire [31:0] t0 = rfds[31:0] + rfdt[31:0];
    wire [31:0] t1 = rfds[63:32] + rfdt[63:32];
    assign rfdr = {t1, t0};
}
reference ADDQ {
    wire [31:0] t0 = rfqs[31:0] + rfqt[31:0];
    wire [31:0] t1 = rfqs[63:32] + rfqt[63:32];
    wire [31:0] t2 = rfqs[95:64] + rfqt[95:64];
    wire [31:0] t3 = rfqs[128:96] + rfqt[128:96];
    assign rfqr = {t3, t2, t1, t0};
}
```

The "regfile" statement defines a base register of 16 entries each of which is 32-bit wide. Because the 64-bit wide register only has 8 entries, it is accessed using 3-bit fields rd, sd, and td. Likewise, the 4-entry 128-bit wide register file is accessed using 2-bit fields rq, sq and tq. This description capability makes it possible to define the more efficient instruction ADDD and ADDQ which perform two and four additions respectively.

The second way of using the wide register file is to use the multiple register entries to represent wider data. For instance, a single-precision floating-point register file can also be viewed as a double-precision register file with half as many entries.

As another example, consider the following use of wide register operands for a cartesian point data type:

```
regfile SCALAR 32 16 x POINT=2
ctype point 64 64 POINT
field sc s[2:0]
field rc r[2:0]
field tc t[2:0]
operand cs sc {POINT[sc]}
operand cr rc {POINT[rc]}
operand ct tc {POINT[tc]}
iclass point_arith {CADD} {out cr, in cs, in ct}
reference CADD {
    assign cr = {cs[63:32]+ct[63:32], cs[31:0]+ct[31:0]};
}
```

This example defines a 32-bit 16-entry base register file "SCALAR" and a "POINT" view that groups every two base registers into a wide register. It then declares a ctype "point" so that it can be used in an application code to declare the point data type. Since the wide register file "POINT" only has half as many registers (eight), it only needs 3 bits to address a register, thus the definition of field "sc", "rc", and "rt". The wide operand "cs", "Cr", and "cr" are defined using the field "sc", "rc", and "tc" to access the wide register file "POINT". Finally, the cartesian point addition instruction "CADD" is defined. This description makes it possible to write application code like:

```
point C1, C2, C3;
....
C3 = CADD(C1, C2);
....
```

There are multiple ways of implementing a register file with multiple groupings. A preferred way is to build it hierarchically and is outlined here:

step 1: dividing the register file into banks. Build multiple banks of the base register file. The number of entries in each bank register file is obtained by dividing the number of entries in the base register file by the largest group number. For the above example, each bank will have 8 entries. The number of banks to build is the same as the largest group number. For the above example, two banks will be built.

step 2: building read ports. The width of the read port is determined by multiplying the base register file width by the largest group number. For the above example, the width is 64. The read port is driven by a mux selecting the read data from various banks according to the low-order bits of the read address. For the above example, the least significant 32-bit of the read port is selected from bank0 if the least significant bit of the read address is 0 and from bank1 if the bit is 1.

step 3: building write ports. The register file has one write data port for each group width. The write data to each of the bank is selected from the appropriate write data depending on the current write group number. For the above example, the write data to bank0 is the single width write data if the write group number is 1, and is the low order 32 bits of the double write data if the write group number is 2.

step 4: building stall logic. The register file stall logic is simply the logical OR of the stall signals from each bank. The code attached as Appendix A shows a RTL implementation for the above example. The code attached as Appendix B shows an implementation of the above procedure in perl.

In the RTL implementation, each input/output register operand is mapped to a read/write port of the corresponding register file. In the prior system, this mapping was done automatically by the TIE compiler. There was no way to override the outcome of the mapping procedure. Since the number of read and write ports of a register file effect both the silicon area and the clock speed of the implementation, it is desirable to be able to specify the operand to register-file port association manually in the TIE description when attempting to optimize certain aspect of the design. The present invention adds this new capability to TIE.

Figure 18:
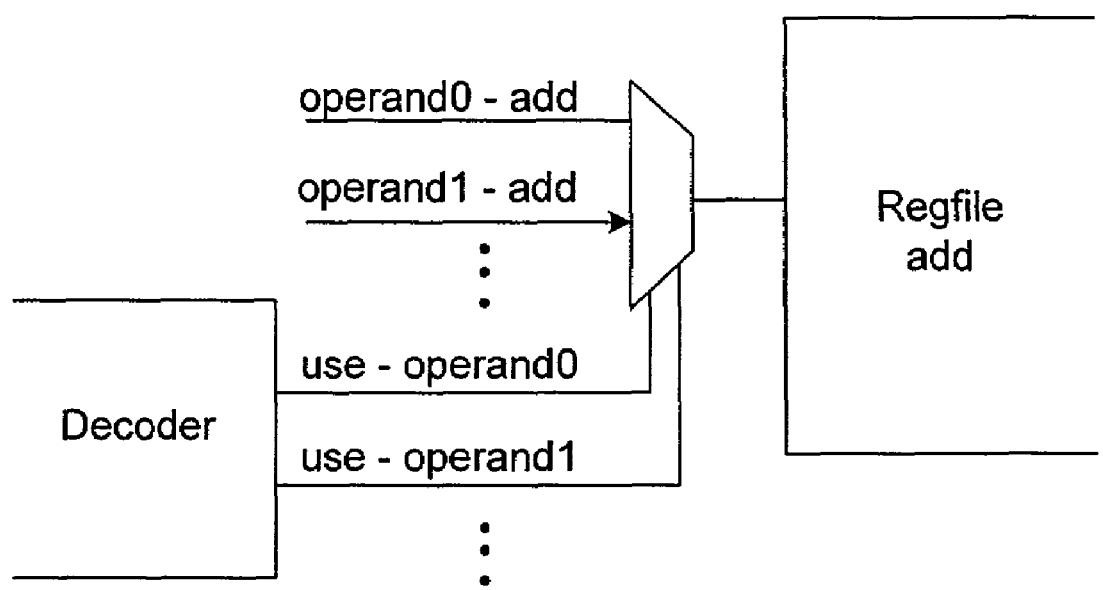
FIG. 18 illustrates enhanced operand register file interface according to the invention.

With multiple register operands mapped to a single physical register file port (read or write), additional muxing logic is needed to generate the read or write address. The data inputs to the mux come from each operand assigned to the port. The select signals to the mux are generated by the decoder. FIG. 18 illustrates the circuit structure of the logic.

In operand definition, the operand semantics is the logic for computing the actual register number from the value stored in an instruction field. In the prior system, the register operand semantics must be a simple identity function, that is the register number must be directly present in an instruction field. Even though this has the advantage of being simple, it is sometimes too restrictive. The present invention extends the TIE language to allow for arbitrary operand semantic description. The "operand" language construct is used to capture an operand semantics.

SYNTAX:
  operand: operand operand-name field-name regfile-name {computation}
  operand: keyword
  operand-name: an unique operand name
  field-name: an previously defined field name
  regfile-name: an previously defined register file name
  computation: operand semantic logic operand-name is the name of the operand to be defined, field-name is the name of a previously defined field which is used as an input to the operand semantic logic, regfile-name is the name of a previously defined register file with which this operand is associated, computation is any logic description for the operand semantics. The field-name must be used as an input in the computation. In addition, the computation can also use other processor states and constants. The computation eventually assigns a value to operand-name. In addition, it can assign values to other processor states.

For example, consider defining an operand to access a subset of the registers in a register file. Given the limited number of bits in an instruction, it is some time desirable to reduce the number of bits dedicated to an register operand when only a subset of the registers need to be accessed. This is illustrated in the following TIE description:

```
state BANK 2
state COUNT 16
regfile XR 32 16 x
field t3 t[2:0]
field t2 t[1:0]
field t1 t[0:0]
operand xeven t3 XR {
    assign xeven = {t3, 1'b0};
}
operand xhigh t3 XR {
    assign xhigh = {1'b1, t3};
}
operand xfirst t1 XR {
    assign xfirst = {3'b0, t1};
}
operand xbanked t2 {
    assign xbanked = {BANK, t2};
}
operand xtracked t XR {
    assign xtracked = t;
    assign COUNT = COUNT + 1'b1;
}
```

In this example, the register file XR can be accessed in many different ways. "xeven" can be used to access any even registers. "xhigh" can be used to access the upper half of the register file. "xfirst" can be used to access one of the first two registers. "xbanked" can be used to access the register in any one of the four banks of XR registers as specified by the state BANK. "xtracked" can access any one of the 16 registers, but has the side effect of keeping the number of times it is used in the state COUNT. The process of implementing hardware for a general register operand is outlined below:
  create a module for the operand
  create an input for the instruction field used by the operand
  create an input for each state used by the operand semantics
  create an input for each interface signal used by the operand semantics create an output for the operand
create an output for each state defined by the operand semantics
create an output for each interface signal defined by the operand semantics
create an output for each exception signal defined by the operand semantics
copy the operand semantics to the module For example, the following operand description:

```
operand ars s AR {
    wire [3:0] wb1 = WindowBase+1;
    wire [3:0] wb2 = WindowBase+2;
    wire [3:0] wb3 = WindowBase+3;
    assign WindowOverflow4 = (s[3:2] != 2'b00) ?
        (((PSWOE && !PSEXCM)) && (WindowStart[wb1])): 0;
    assign WindowOverflow8 = (s[3] == 1'b1) ?
        (((PSWOE && !PSEXCM)) && (WindowStart[wb2])): 0;
    assign WindowOverflow12 = (s[3:2] == 2'b11) ?
        (((PSWOE && !PSEXCM)) && (WindowStart[wb3])): 0;
    assign ars = s + {WindowBase, 2'b00};
}
``` will result in a verilog module with

| | |
|---|---|
| input s | /* operand field */ |
| input WindowStart | /* used state */ |
| input WindowBase | /* used state */ |
| input PSWOE | /* used state */ |
| input PSEXCM | /* used state */ |
| output WindowOverflow4 | /* exception */ |
| output WindowOverflow8 | /* exception */ |
| output WindowOverflow12 | /* exception */ |
| output ars | /* operand output */ |

In the prior processor generation system, a register operand must be defined as a function of an instruction field. The present invention allows for the definition of a register operand to be independent of any instruction field. An operand not depending on any instruction field is called an "implicit" operand. The present invention adds the following construct to the TIE language to capture the implicit operand.

SYNTAX:
implicit-operand-def: implicit_operand operand-name regfile-name {computation}
implicit_operand: keyword
operand-name: an unique operand name
regfile-name: a previously defined register file name
computation: operand semantic logic where operand-name is an unique name of the operand to be defined. regfile-name is a previously defined register file with which this operand is associated. computation is any logic description and must eventually assign a value to operand-name.

Consider the following example of defining implicit operands to access a register file:

```
state INDEX 4
regfile XR 32 16 x
implicit_operand x0 XR {
    assign x0 = 0;
}
```

-continued

```
implicit_operand xr XR {
    assign xr = INDEX;
}
```

This example defines two implicit operands. "x0" can be used to access the first register in the register file XR. "xr" can be used to access any register numbered by the state INDEX. Both of these operands are implicit because they do not depend on any instruction fields. The RTL implementation of the implicit operand is very similar to that of the general operand, with the exception that the field input to the operand module is omitted because implicit operands do not depend on any instruction field.

In the prior processor generation system, a TIE instruction cannot raise exceptions. For example, it was not possible to define a TIE instruction that performs a division and raise a divide-by-zero exception if the divisor is zero. Likewise, it was not possible for a TIE load instruction to raise an unaligned-load exception when the address is not aligned. The present invention adds this new capability. The process of defining an exception has two steps: defining an exception and specifying the conditions under which the exception is to be raise. They are described hereinbelow.

An processor exception can be defined using the TIE exception construct. An exception has semantics that is the logic to be evaluated when the exception is taken. An exception can be raised by an instruction in its semantic logic or operand logic. An exception can also be raised as the result of evaluating the semantics of another exception. Exceptions have priorities. If an instruction raises several exceptions, the one with the highest priority will be taken by the processor.

SYNTAX:
exception-def: exception name {higher-priority-list} {computation}
exception: keyword
name: an unique exception name
higher-priority-list: list of exception names with higher priority
computation: exception logic for what to do when this exception is taken where "name" is an unique name of the exception. "higher-priority-list" is a list of exception names with higher priority. It is not necessary for an exception to be in the list if it has higher priority than at least one other exception in the list. For example, if exception A has higher priority than exception B which in turn has higher priority than exception C, it is sufficient to just put B in the higher-priority-list of C. "computation" specifies the logic to be evaluated when the exception is taken. It can read processor states and interface signals, and assign values to processor states and interface signals. Moreover, it can also raise another exception upon certain conditions. The exception semantic logic must contain an assignment to the processor interface signal "Exception Vector". Optionally, it can assign certain value to the processor state EXCCAUSE as a way of passing some information to the exception handler for the cause of the exception.

Consider an example of defining an overflow exception for an add instruction:

```
exception add_overflow {
    WindowOverflow4, WindowOverflow8, WindowOverflow12
} {
    assign ExceptionVector = 32'h40000810;
}
```

This example defines a new exception "add_overflow". It has lower priority than the exception WindowOverflow4, WindowOverflow8, and WindowOverflow12. When this exception is taken, the processor will jump to location 32'h40000810 which should be loaded with the handler for this exception.

To allow for an instruction to conditionally raise an exception, the TIE iclass construct has been extended to have an additional clause for specifying a list of exception names. With the iclass definition, the instruction semantics can assign values to the exception names. The list of exceptions in the iclass qualifies the exceptions that can ever be raised for the opcodes in the iclass. For example, if an add instruction can raise the overflow exception defined in the previous section, its iclass may look like:

```
iclass add {ADD} {out arr, in ars, in art} { } { } {out add_overflow}
```

With this iclass definition, the semantic logic can assign "add_overflow" with 1 when an overflow occurs during the addition.

```
reference ADD {
    wire [31:0] tmp = ars + art;
    assign arr = tmp;
    wire ss = ars[31];
    wire st = art[31];
    wire sr = tmp[31];
    assign add_overflow = ~ss & ~st & sr | ss & st & ~sr;
}
```

Raising an exception in an operand semantics is allowed by this invention, and can be specified by assigning the exception with a logic expression. When the expression is evaluated to 1, and when the exception is included in the list of exceptions for the iclass of the opcode, the exception is raised. For example:

```
regfile XR 32 16 x
operand xr r XR {
    assign xr = r;
    assign last_exception = r == 4'b1111;
}
```

It raises the "last_exception" when an instruction attempts to access the last entry in the register file.

An exception raised by an instruction or operand semantics is called a primary exception. An exception raised by another exception is called a secondary exception. Raising a secondary exception in an exception semantics is also allowed by this invention, and can be specified by assigning the exception with a logic expression. When the expression is evaluated to 1, the exception is raised. For example:

```
exception exc_s { } {
    assign ExceptionVector = ...
}
exception exc_p { } {
    assign ExceptionVector = ...
    assign exc_s = COND == 4'b1011;
}
```

When the exception "exc_p" is raised by an instruction, it will raise the exception "exc_s" if the state "COND" has value "4b1011".

The example implementation described here handles primary and secondary exceptions. However, the method is general and handles any fixed depth of exception nesting. The extension from the example implementation is entirely straightforward and obvious to one skilled in the art.

Figure 19:
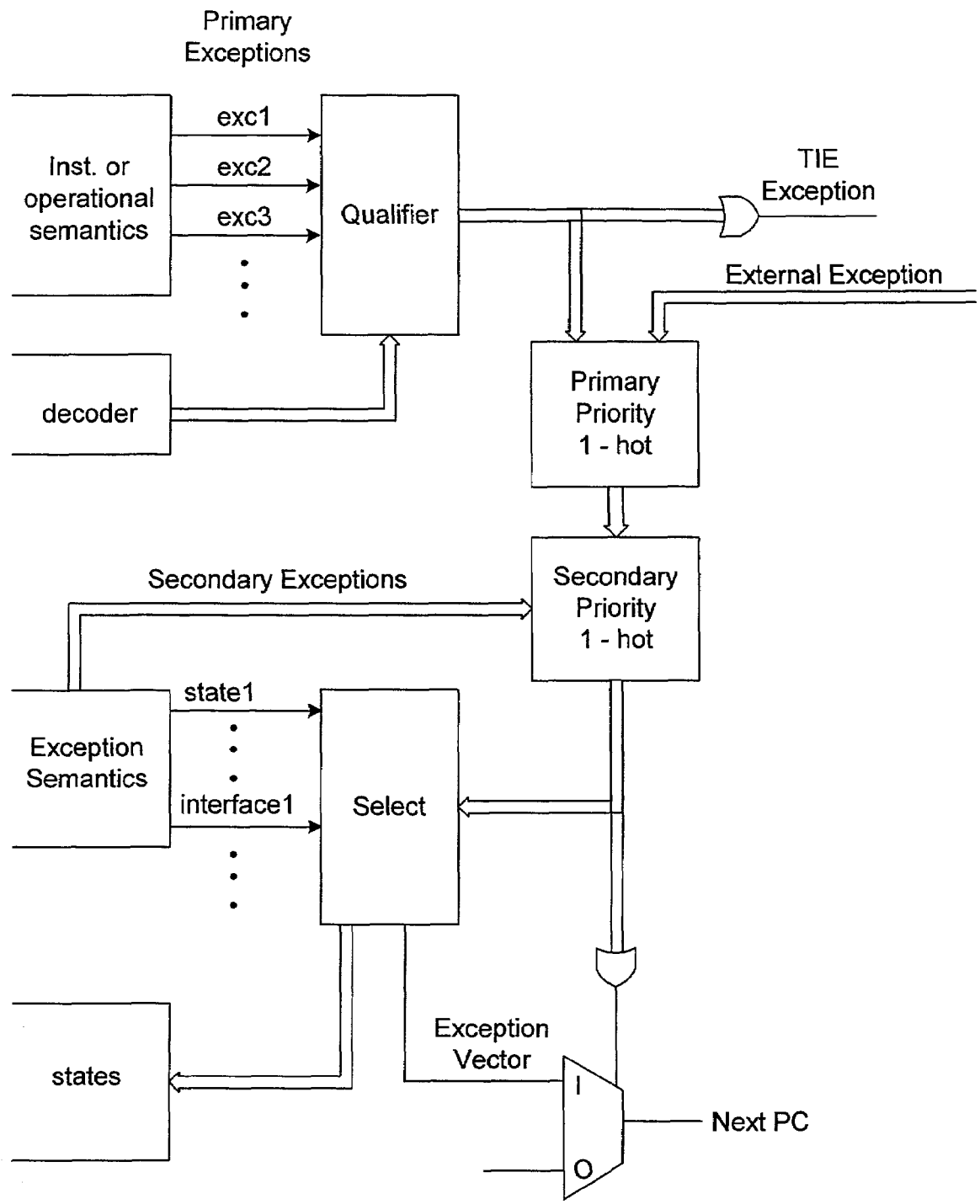
FIG. 19 is a block diagram for illustrating exception handling according to an aspect of the invention.

When multiple primary exceptions are raised, the one with the highest priority is selected. Then, the semantics of that exception is evaluated. If the semantics raises one or more secondary exceptions, the highest priority one among the secondary exceptions will be taken. When there are no secondary exceptions, the selected primary exception is taken. FIG. 19 shows one way of implementing the exception logic. The qualifier 1 block accepts exception signals from all the instruction semantic blocks and operand semantic blocks. Using decoding signals from the decoder, it selectively turns off the exception based on whether the exception is in the list of exceptions to be raised by the current instruction. After the qualification, the logic generates a TIE_Exception signal to the external logic. The external logic also sends a list of external exception signals to the exception generation logic. The combined exception signals are then fed into a priority logic block such that all but the highest priority signal are turned off. After the priority logic, there is no more than one exception active. Parallel to prioritizing the primary exception signals is the logic for generating the secondary exception signals in the exception semantic blocks. The set of secondary exception signals along with the prioritized primary exception signals are fed to the secondary priority logic block. In this block, any secondary exception signals not associated with the currently active primary signal are turned off. The remaining secondary signals are prioritized and all but the one with highest priority are turned off. Finally, the active primary signal is turned off if any of its secondary exceptions is active. After the secondary priority logic, the exception signals are used to select the states and interface signals generated by the exception semantics. Only the ones corresponding to the active exception are selected. One of the interface signals defined by the exception semantics is the exception vector. This exception is selected to be the next PC if an exception happens.

As mentioned above, another aspect of the invention is the addition of certain built-in modules. In this regard, it is noted that certain commonly used computations have no language-defined operators. However, using other language constructs is either very tedious to describe or very hard to implement efficiently. TIE provides a set of commonly used operators as built-in modules invoked in the similar way as function calls. The following are the rules common to all built-in modules: Each built-in module has its own definition of computed-width. The definition is not effected by the required-width of the context. The inputs to the built-in modules have no required-width. In the case where an input does not have enough bits as needed by the definition of the built-in module, it is 0-extended.

The following are descriptions of built-in modules according to a preferred implementation of the invention.

TIEadd:
Synopsis: sum=TIEadd(a, b, cin)
Definition: sum=a+b+cin
Description: Addition with carry-in. It is an error if the TIEadd does not have three arguments and the computed-width of the last argument is not 1. If the computed-width of a and b are different, the narrower input is evaluated in its computed-width and then 0-extended.

TIEaddn
Synopsis: sum=TIEaddn(A0, A1, . . . , An-1)
Definition: sum=A0+A1$^+$ . . . +An-1
Description: N-number addition. There must be at least three arguments to the built-in module. If the computed-width of the inputs are different, the narrower inputs are evaluated in their computed-width and then 0-extended. The advantage of using the TIEaddn built-in module is that the underlying RTL implementation will be much more timing and area efficient than simply using the +operator.

TIEcsa
Synopsis: {carry, sum}=TIEcsa(a, b, c)
Definition: carry=a & b|a & c|b & c
sum=aˆ bˆ c
Description: Carry-save adder. TIEcsa must have exactly three arguments. If the computed-width of the inputs are different, the narrower inputs are evaluated in their computed-width and then 0-extended. The computed-width of TIEcsa is twice of the input width. The lower half of the result represents the sum bits and the upper half the carry bits. In order to add the sum and carry, the carry must be shifted to the left by 1 bit. This module is provided to allow efficient implementation of adding or subtracting several numbers, accomplished by a serious of csa reduction followed by a single adder.

TIEcmp
Synopsis: {lt, le, eq, ge, gt}=TIEcmp(a, b, signed)
Definition: {lt, le, eq, ge, gt}={a<b, a<=b, a=b, a>=b, a>b}
Description: Signed and unsigned comparison. It is an error if the TIEcmp does not have three arguments and the computed-width of the last argument is not 1. If the computed-width of a and b are different, the narrower input is evaluated in its computed-width and then 0-extended. If the input signed is true, the comparison is for signed data. Otherwise, the comparison is for unsigned data.

TIEmac
Synopsis: o=TIEmac(a, b, c, signed, negate)
Definition: o=negate ? c-a * b:c+a*b
Description: Multiply-accumulate. The multiplication is signed if signed is true and unsigned otherwise. The multiplication result is subtracted from the accumulator c if negate is true and added to the accumulator c otherwise. If the computated-width of the multiplication is less than the width of the accumulator, the multiplication result is sign-extended if signed is true and 0-extended otherwise. The computed-width of signed and negate must be 1. In order to avoid slowing down the clock frequency of the Xtensa, any instruction that uses TIEmac should be allocated with at least two cycles. However, by carefully choosing the instruction schedule, it is possible to achieve the throughput of one TIEmac operation per cycle.

TIEmul
Synopsis: prod=TIEmul(a, b, signed)
Definition: prod=a * b
Description: Multiply. The multiplication is signed if signed is true and unsigned otherwise. The computed-width of signed must be 1. In order to avoid slowing down the clock frequency of the Xtensa, any instruction that uses TIEmul should be allocated with at least two cycles.

TIEmulpp
Synopsis: {p0, p1}=TIEmulpp(a, b, signed, negate)
Definition: p0+p1=negate ?-a * b:a * b
Description: Partial-product multiply. This modules returns two partial products of the multiplication. The multiplication is signed if signed is true and unsigned otherwise. The sum of the two partial products equals the product. If negate is true, the sum equals the negative of the product. The definition does not give specific meaning to the individual partial product. The computed-width of signed and negate must be 1. This module is provided to allow efficient implementation of certain algebraic expressions involving multiplications, additions, and subtractions.

TIEmux
Synopsis: o=TIEmux(s, D0, D1, . . . , Dn-1)
Definition: o=s==0 ? D0: s==1 ?D1: . . . : s==n-2 ? Dn-2: Dn-1
Description: n-way multiplexor. This module returns one of the n data depending on the value of the select signal. The number of data, n, must be power-of-2. The width of the select signal must be log2(n).

TIEpsel
Synopsis: o=TIEpsel(S0, D0, S1, D1, . . . , Sn-1, Dn-1)
Definition: o=S0 ? D0: S1 ? D1: . . . : Sn-1 ? Dn-1:0
Description: n-way priority selector. This module selects one of n input data according the values and priorities of the select signals. The first select signal has the highest priority and the last the lowest. If none of the selection signal is active, the result is 0. The width of select signals must be 1.

TIEsel
Synopsis: o=TIEsel(S0, D0, S1, D1, . . . , Sn-1, Dn-1)
Definition: o=S0 ? D0: S1 ? D1: . . . :Sn-1 ? Dn-1:0
Description: n-way 1-hot selector. This module selects one of n input data according the values of the select signals. The select signals are expected to be 1-hot. If none of the selection signal is active, the result is 0. If more than 1 select signal is active, the result is undefined. The width of select must be 1.

Although the present invention has been particularly described with reference to the preferred embodiments thereof, it should be readily apparent to those of ordinary skill in the art that changes and modifications in the form and details may be made without departing from the spirit and scope of the invention. For example, those skilled in the art will understand that variations can be made in the number and order of processing steps illustrated in the above flow diagrams. It is intended that the appended claims include such changes and modifications.

What is claimed is:

1. A computer-implemented method for generating a hardware description of a microprocessor the method comprising:

enabling a user to define a plurality of operations that can be performed in parallel in various combinations during execution of a single VLIW instruction by the microprocessor;

enabling the user to specify a first set of the plurality of operations to be performed during execution of a first user-defined VLIW instruction;

enabling the user to specify a second set of the plurality of operations to be performed during execution of a second user-defined VLIW instruction, the first and second user-defined VLIW instructions also having a user-defined configurable characteristic; and automatically generating the hardware description of the microprocessor, including generating a description of logic that is capable of performing each of the plurality of operations in parallel, and further including generating a description of logic that is capable of executing the first and second user-defined VLIW instructions in the microprocessor, in addition to a pre-defined set of core instructions for execution by a pre-defined microprocessor core, based on the user definition of the plurality of operations, the configurable characteristic and the first and second user-defined VLIW instructions.

2. A method according to claim 1, wherein the configurable characteristic comprises instruction length.

3. A method according to claim 1, wherein the configurable characteristic comprises instruction format.

4. A method according to claim 1, wherein the configurable characteristic comprises the number of operation slots per instruction format.

5. A method according to claim 1, wherein the configurable characteristic comprises instruction fields.

6. A method according to claim 1, wherein the configurable characteristic comprises instruction opcodes.

7. A method according to claim 1, wherein the configurable characteristic comprises instruction operations.

8. A method according to claim 1, wherein a portion of the VLIW instruction includes one or more of the pre-defined set of core instructions.

9. A method according to claim 1, wherein the VLIW instruction is a single instruction multiple data (SIMD) instruction.

10. A method according to claim 1, wherein at least two of the plurality of operations of the VLIW instruction have operands both addressing a common single register file, and wherein the automatically generating step includes generating a plurality of register operand interfaces for the single register file to support simultaneous access by the operands for the plurality of operations executing in parallel.

11. A method according to claim 10, wherein the configurable characteristic includes information associating the operands with different respective ports of the single register file.

12. A method according to claim 1, wherein first and second ones of the plurality of operations of the VLIW instruction have operands addressing a register file, and wherein the configurable characteristic comprises register file access width, and wherein the automatically generating step includes generating a register operand interface that allows the first operation to access the register file with a first register file access width, and allows the second operation to access the register file with a second register file access width, the first and second register file access widths being different.

13. A method according to claim 1, wherein first and second ones of the plurality of operations of the VLIW instruction have operands addressing a register file, and wherein the configurable characteristic comprises a number of adjacent entries of the register file that are accessed by a single operand addressing the register file, and wherein the automatically generating step includes generating a register operand interface that allows the first operation to access a first number of adjacent entries of the register file, and allows the second operation to access a second number of adjacent entries of the register file, the first and second numbers being different.

14. A method according to claim 1, wherein one of the plurality of operations of the VLIW instruction uses an implicit register file operand to address a register file, and wherein the configurable characteristic comprises an implicit register file operand definition, and wherein the automatically generating step includes generating a register operand interface supporting the one operation, such that no bits of the VLIW instruction are required to explicitly encode the implicit register file operand.

15. A method according to claim 1, wherein at least two of the plurality of operations comprise load/store instructions associated with a plurality of load/store units.

16. A method according to claim 15, wherein the configurable characteristic includes associating one of the at least two operations with a specific one of the load/store units.

17. A method according to claim 15, wherein the automatically generating step includes automatically mapping at least one of the load/store instructions to available ones of the load/store units if the configurable characteristic does not explicitly associate one of the load/store units with the at least one load/store instruction.

* * * * *